(12) United States Patent
Lin

(10) Patent No.: US 11,532,486 B2
(45) Date of Patent: Dec. 20, 2022

(54) DISHING PREVENTION STRUCTURE EMBEDDED IN A GATE ELECTRODE

(71) Applicant: Taiwan Semiconductor Manufacturing Company, Ltd., Hsin-Chu (TW)

(72) Inventor: Ta-Wei Lin, Minxiong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/501,327

(22) Filed: Oct. 14, 2021

(65) Prior Publication Data
US 2022/0068660 A1 Mar. 3, 2022

Related U.S. Application Data

(62) Division of application No. 16/532,753, filed on Aug. 6, 2019, now Pat. No. 11,152,222.

(51) Int. Cl.
*H01L 21/321* (2006.01)
*H01L 29/423* (2006.01)
*H01L 29/40* (2006.01)
*H01L 27/088* (2006.01)

(52) U.S. Cl.
CPC ........ *H01L 21/3212* (2013.01); *H01L 27/088* (2013.01); *H01L 29/401* (2013.01); *H01L 29/42372* (2013.01)

(58) Field of Classification Search
CPC ......... H01L 29/40–518; H01L 21/3212; H01L 21/7684; H01L 21/76877–76883; H01L 21/823456; H01L 27/088; H01L 29/401; H01L 29/42372
See application file for complete search history.

(56) References Cited

U.S. PATENT DOCUMENTS

| | | | |
|---|---|---|---|
| 6,307,264 B1 | 10/2001 | Fukumoto | |
| 6,417,106 B1 | 7/2002 | Twu et al. | |
| 6,423,619 B1 | 7/2002 | Grant et al. | |
| 9,653,460 B1 | 5/2017 | Li et al. | |
| 9,887,158 B1 | 2/2018 | Li et al. | |
| 2012/0319180 A1* | 12/2012 | Chuang | H01L 21/823437 257/288 |
| 2012/0319238 A1 | 12/2012 | Chuang et al. | |

(Continued)

OTHER PUBLICATIONS

Non-Final Office Action dated Mar. 18, 2021 for U.S. Appl. No. 16/532,753.

(Continued)

*Primary Examiner* — Eric A. Ward
(74) *Attorney, Agent, or Firm* — Eschweiler & Potashnik, LLC

(57) ABSTRACT

Various embodiments of the present disclosure are directed towards a semiconductor device. The semiconductor device includes a semiconductor substrate. A gate dielectric is disposed over the semiconductor substrate. A first source/drain region and a second source/drain region are disposed in the semiconductor substrate and on opposite sides of the gate dielectric. A gate electrode is disposed over the gate dielectric. A first dishing prevention structure is embedded in the gate electrode, where a perimeter of the first dishing prevention structure is disposed within a perimeter of the gate electrode.

20 Claims, 17 Drawing Sheets

(56) References Cited

U.S. PATENT DOCUMENTS

| | | |
|---|---|---|
| 2014/0239417 A1 | 8/2014 | Wang et al. |
| 2015/0115375 A1* | 4/2015 | Yoo .................. H01L 29/66553 |
| | | 257/411 |
| 2017/0110536 A1 | 4/2017 | Hsiao et al. |
| 2017/0170072 A1 | 6/2017 | Hwang et al. |
| 2018/0301348 A1 | 10/2018 | Lin |

OTHER PUBLICATIONS

Notice of Allowance dated Jun. 21, 2021 for U.S. Appl. No. 16/532,753.

* cited by examiner

DISHING PREVENTION STRUCTURE EMBEDDED IN A GATE ELECTRODE

REFERENCE TO RELATED APPLICATION

This Application is a Divisional of U.S. application Ser. No. 16/532,753, filed on Aug. 6, 2019, the contents of which are hereby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
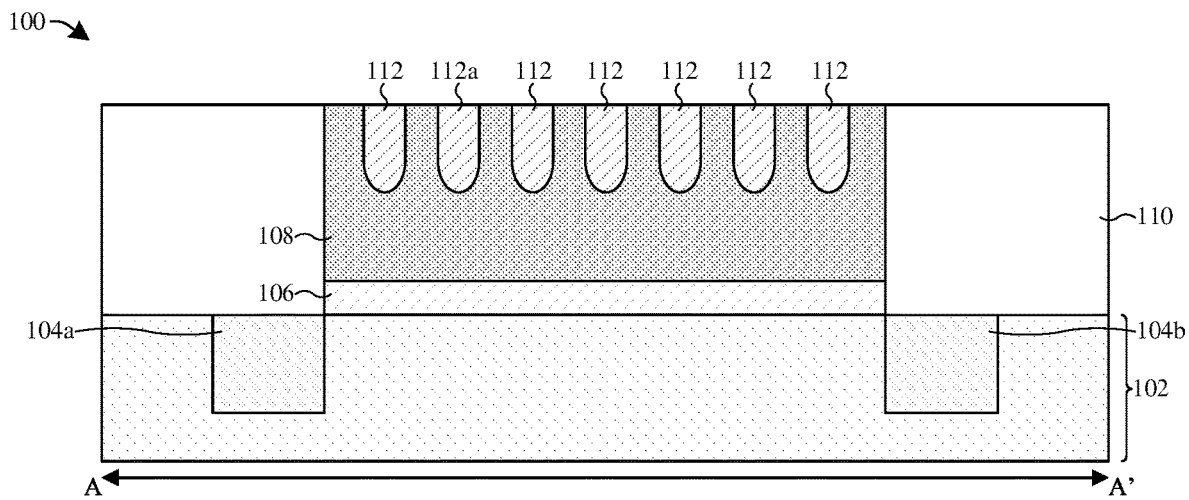
FIGS. 1A-1C illustrate various views of some embodiments of a semiconductor device having a plurality of dishing prevention structures embedded in a gate electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some metal-oxide-semiconductor field-effect transistors (MOSFETs) comprise a metal gate electrode disposed over a gate dielectric (e.g., high-k dielectric). In some embodiments, a method for forming a MOSFET with a metal gate electrode comprises forming an opening in an interlayer dielectric (ILD) structure. The opening corresponds to the metal gate electrode. Thereafter, a conductive material (e.g., a metal) is deposited over the ILD structure and in the opening. A chemical-mechanical polishing (CMP) process is then performed into the conductive material and the ILD structure to form the gate electrode.

One challenge with the above method is the CMP process causing dishing of the conductive material deposited in the opening. For example, due to process parameters of the CMP process (e.g., chemical slurry composition, pressure, velocity, time, etc.) and the different chemical compositions of the ILD structure and the conductive material, the CMP process may remove the conductive material at a faster rate than the ILD structure, thereby dishing the conductive material deposited in the opening. This dishing may be exacerbated as the size of the opening increases (e.g., high-voltage devices having large gates). Accordingly, the dishing may negatively affect performance of the MOSFET due to excess removal of the conductive material undesirably reducing the size (e.g., height) of the metal gate electrode. Further, in some severe instances, the dishing may cause the MOSFET to improperly function due to complete (or near complete) removal of the conductive material in the opening.

Various embodiments of the present application are directed toward a method for forming a semiconductor device. The method includes forming a first opening over a gate dielectric. A conductive material is deposited over the gate dielectric and in the first opening. A second opening is formed in the conductive material and spaced from the gate dielectric, where a perimeter of the second opening is disposed within a perimeter of the gate dielectric. A dishing prevention material is deposited on the conductive material and in the second opening. A planarization process (e.g., chemical-mechanical polishing (CMP)) is performed into the dishing prevention material and the conductive material to form a dishing prevention structure embedded in a gate electrode. Because the dishing prevention material is deposited in the second opening, the dishing prevention material provides structural support during formation of the semiconductor device to mitigate the amount of dishing of the conductive material. Accordingly, performance of the semiconductor device may be improved and/or a cost to fabricate the semiconductor device may be reduced.

Figure 1B:
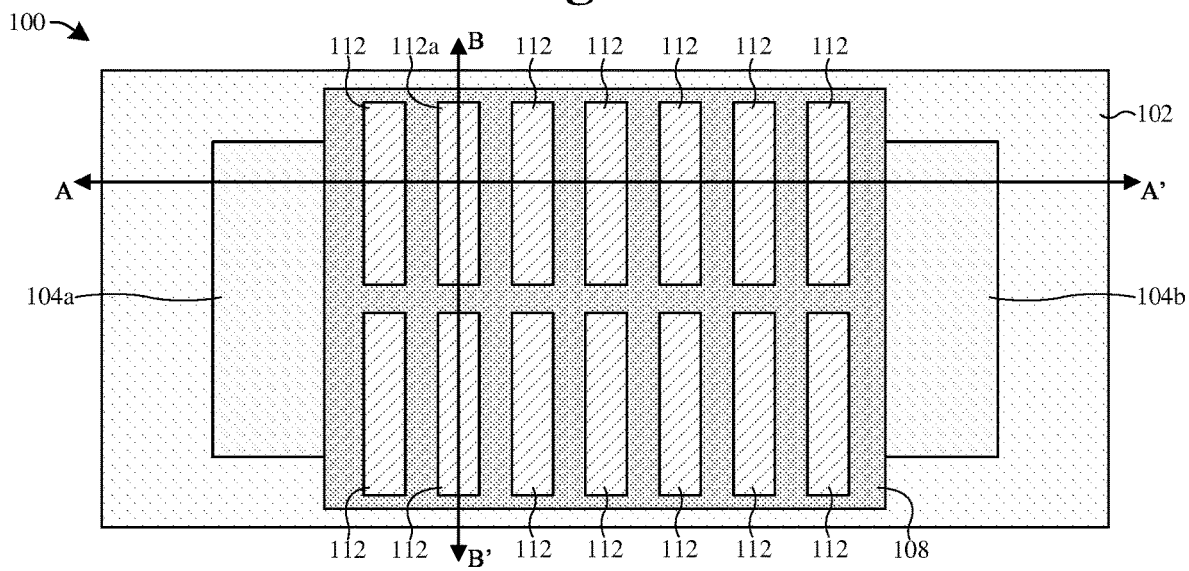
Figure 1C:
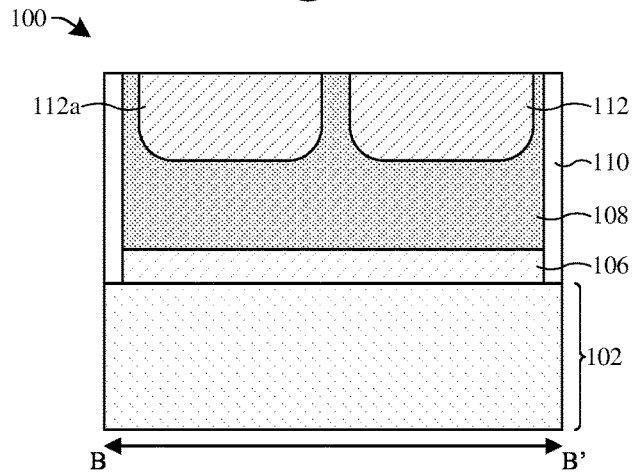

FIGS. 1A-1C illustrate various views of some embodiments of a semiconductor device 100 having a plurality of dishing prevention structures 112 embedded in a gate electrode 108. FIG. 1A illustrates a cross-sectional view of the semiconductor device 100 of FIG. 1B taken along line A-A'. FIG. 1B illustrates a top-view of the semiconductor device 100 without an interlayer dielectric (ILD) structure 110. FIG. 1C illustrates a cross-sectional view of the semiconductor device 100 of FIG. 1B taken along line B-B'

As shown in FIGS. 1A-1C, the semiconductor device 100 is disposed on/in a semiconductor substrate 102. In some embodiments, the semiconductor substrate 102 may comprise any type of semiconductor body (e.g., monocrystalline silicon/CMOS bulk, silicon-germanium (SiGe), silicon on insulator (SOI), etc.). The semiconductor device 100 comprises a pair of source/drain regions 104a-b, for example, a first source/drain region 104a and a second source/drain region 104b. The source/drain regions 104a-b are regions of the semiconductor substrate 102 having a first doping type (e.g., n-type or p-type).

A gate dielectric 106 is disposed over the semiconductor substrate 102 and between the source/drain regions 104a-b. In some embodiments, the gate dielectric 106 may comprise, for example, an oxide (e.g., silicon dioxide ($SiO_2$)), a high-k dielectric material (e.g., hafnium oxide ($HfO_2$), zirconium oxide ($ZrO_2$), or some other dielectric material with a dielectric constant greater than about 3.9), some other dielectric material, or a combination of the foregoing. A gate electrode 108 is disposed over the gate dielectric 106 and between the source/drain regions 104a-b. In some embodiments, the gate electrode 108 may comprise, for example, doped polysilicon (e.g., n-type/p-type polysilicon), a metal (e.g., tungsten (W), aluminum (Al), titanium (Ti), molybdenum (Mo), or the like), or the like. An interlayer dielectric (ILD) structure 110 is disposed over the semiconductor substrate 102 and around both the gate electrode 108 and the gate dielectric 106. In some embodiments, the ILD structure 110 comprises one or more stacked ILD layers, which may respectively comprise a low-k dielectric (e.g., a dielectric material with a dielectric constant less than about 3.9), an oxide (e.g., $SiO_2$), or the like.

A plurality of dishing prevention structures 112 are embedded in the gate electrode 108. The plurality of dishing prevention structures 112 have a different chemical-mechanical polishing (CMP) removal rate than the gate electrode 108 for a given CMP process. For example, by performing the given CMP process, which has predefined process parameters, on the dishing prevention structures 112 and the gate electrode 108, the CMP process may remove portions of the dishing prevention structures 112 at a first CMP removal rate and portions of the gate electrode 108 at a second CMP removal rate that is greater than the first CMP removal rate. Because the dishing prevention structures 112 are embedded in the gate electrode 108 and because the second CMP removal rate is greater than the first CMP removal rate, the dishing prevention structures 112 may reduce an amount of dishing to the gate electrode 108 caused by the given CMP process. Accordingly, performance of the semiconductor device 100 may be improved and/or a cost to fabricate the semiconductor device 100 may be reduced.

For clarity, some features of a first dishing prevention structure 112a of the plurality of dishing prevention structures 112 will be described, and it will be appreciated that each of the dishing prevention structures 112 may also have such structural features. For example, the first dishing prevention structure 112a may have sidewalls that extend vertically in a substantially straight line. Therefore, it will be appreciated that each of the dishing prevention structures 112 may have sidewalls that extend vertically in a substantially straight line.

In some embodiments, a bottom surface of the first dishing prevention structure 112a may be rounded and be connected to a first pair of opposite sidewalls of the first dishing prevention structure 112a. The first pair of opposite sidewalls are spaced apart in a first direction (e.g., along a direction in which line A-A' extends). In further embodiments, the first dishing prevention structure 112a has a second pair of opposite sidewalls that are spaced apart in a second direction perpendicular to the first direction (e.g., along a direction in which line B-B' extends). The rounded bottom surface may extend laterally in the second direction along a substantially straight line.

Figure 2A:
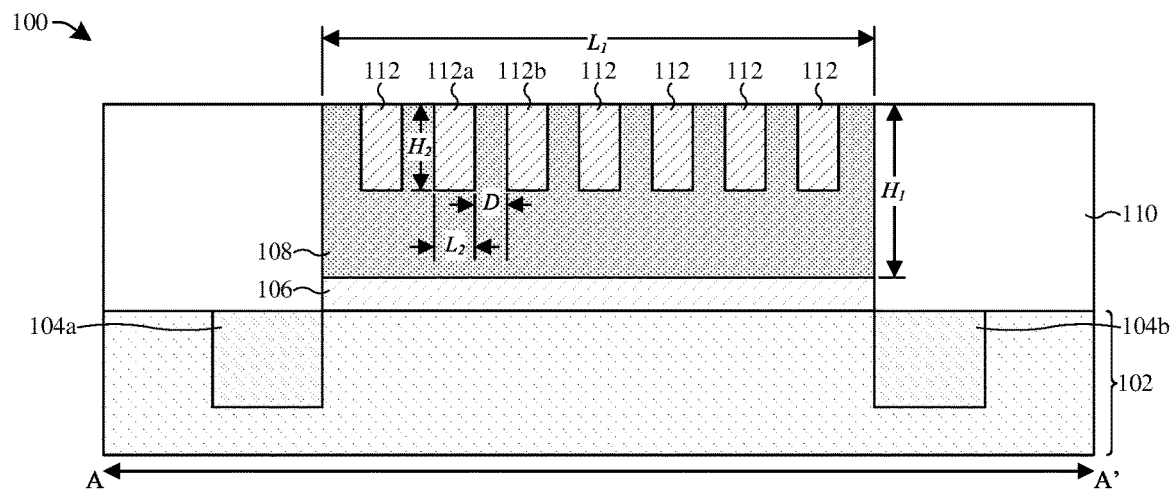
FIGS. 2A-2C illustrate various views of some other embodiments of the semiconductor device of FIGS. 1A-1C.
Figure 2B:
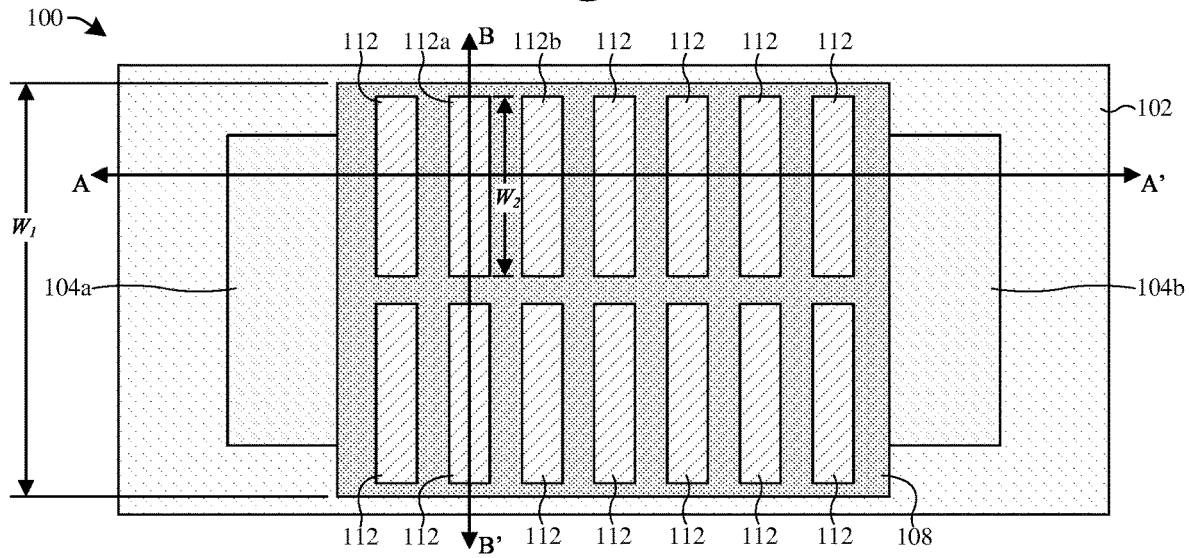
Figure 2C:
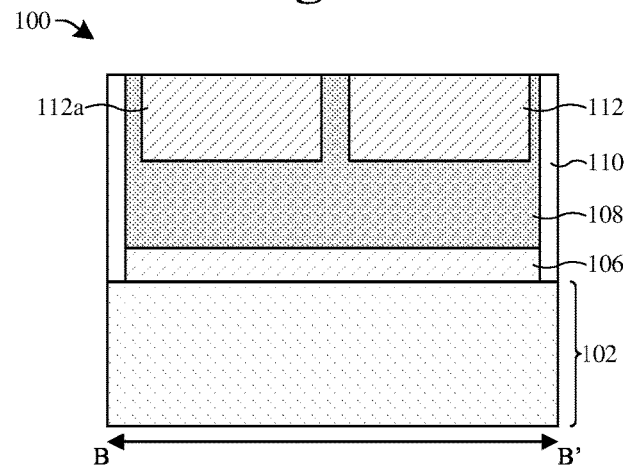

FIGS. 2A-2C illustrate various views of some other embodiments of the semiconductor device 100 of FIGS. 1A-1C. FIG. 2A illustrates a cross-sectional view of the semiconductor device 100 of FIG. 2B taken along line A-A'. FIG. 2B illustrates a top-view of some other embodiments of the semiconductor device 100 of FIG. 1B without an ILD structure 110. FIG. 2C illustrates a cross-sectional view of the semiconductor device 100 of FIG. 2B taken along line B-B'.

As shown in FIGS. 2A-2C, the bottom surface of the first dishing prevention structure 112a is disposed between an upper surface of the gate electrode 108 and a bottom surface of the gate electrode 108. An outer perimeter of the first dishing prevention structure 112a is disposed within an outer perimeter of the gate electrode 108. In some embodiments, the bottom surface of the first dishing prevention structure 112a is substantially planar. In some embodiments, the first pair of opposite sidewalls may extend vertically in a substantially straight line and may connect to the substantially planar bottom surface of the first dishing prevention structure 112a at an angle (e.g., 90 degrees). In other embodiments, the first pair of opposite sidewalls may extend vertically in a substantially straight line and may be joined to the substantially planar bottom surface of the first dishing prevention structure 112a by rounded corners.

The gate electrode 108 has a first length $L_1$, a first width $W_1$, and a first height $H_1$. The first dishing prevention structure 112a has a second length $L_2$, a second width $W_2$, and a second height $H_2$. The first dishing prevention structure 112a may be spaced from a second dishing prevention structure 112b by a distance D. In some embodiments, a ratio between the first height $H_1$ and the second height $H_2$ may be between about 2:1 and about 5:1. In further embodiments, the second length $L_2$ may be less than or equal to about 33% of the first length $L_1$. In further embodiments, the second width $W_2$ may be between about 99.9% and about 0.1% of the first width $W_1$.

In some embodiments, the first length $L_1$ may be greater than or equal to about 1.5 micrometers (um). In further embodiments, the first width $W_1$ may be greater than or equal to about 1 um. In further embodiments, the second length $L_2$ may be between about 0.15 um and about 0.5 um.

In yet further embodiments, the second width $W_2$ may be greater than or equal to about 0.13 um.

In some embodiments, the distance D may be greater than or equal to about 0.13 um. In further embodiments, each of the dishing prevention structures 112 may be spaced from a nearest neighboring dishing prevention structure by a same distance. In other embodiments, some of the dishing prevention structures 112 may be spaced from a nearest neighboring dishing prevention structure by a different distance than some other of the dishing prevention structures 112. In yet further embodiments, the distance D and the second width $W_2$ may be substantially the same. In other embodiments, the distance D and the second width $W_2$ may be different.

A first area is defined by the first length $L_1$ multiplied by the first width $W_1$. The first dishing prevention structure 112a has a second area (e.g., the second length $L_2$ multiplied by the second width $W_2$). In some embodiments, a sum of the areas of each of the dishing prevention structures 112 is between about 5% and about 25% of the first area. In further embodiments, an area of the gate electrode 108 is between about 75% and about 95% of the first area.

In some embodiments, the dishing prevention structures 112 comprise a material having a CMP removal rate that is less than a CMP removal rate of the material of the gate electrode 108. In further embodiments, the dishing prevention structures 112 may comprise, for example, an oxide (e.g., $SiO_2$), a nitride (e.g., silicon nitride (SiN)), an oxynitride (e.g., silicon oxy-nitride ($SiO_XN_Y$)), some other material capable of trench gap filling and having a CMP removal rate different than (e.g., less than) the gate electrode 108, or a combination of the foregoing. In embodiments in which the dishing prevention structures 112 comprise a dielectric, the dishing prevention structures 112 may be referred to as dielectric structures.

Figure 3A:
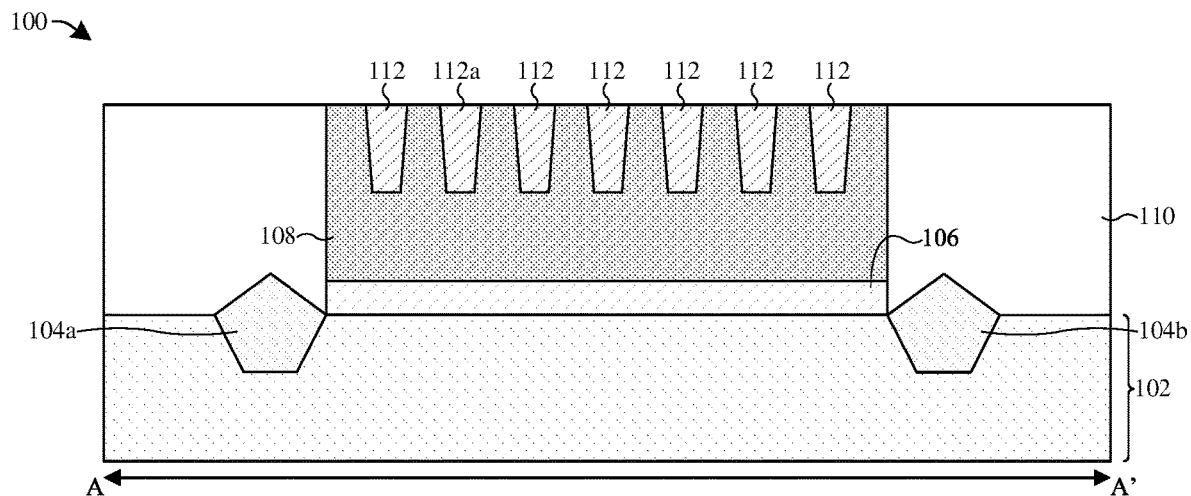
FIGS. 3A-3C illustrate various views of some other embodiments of the semiconductor device of FIGS. 1A-1C.
Figure 3B:
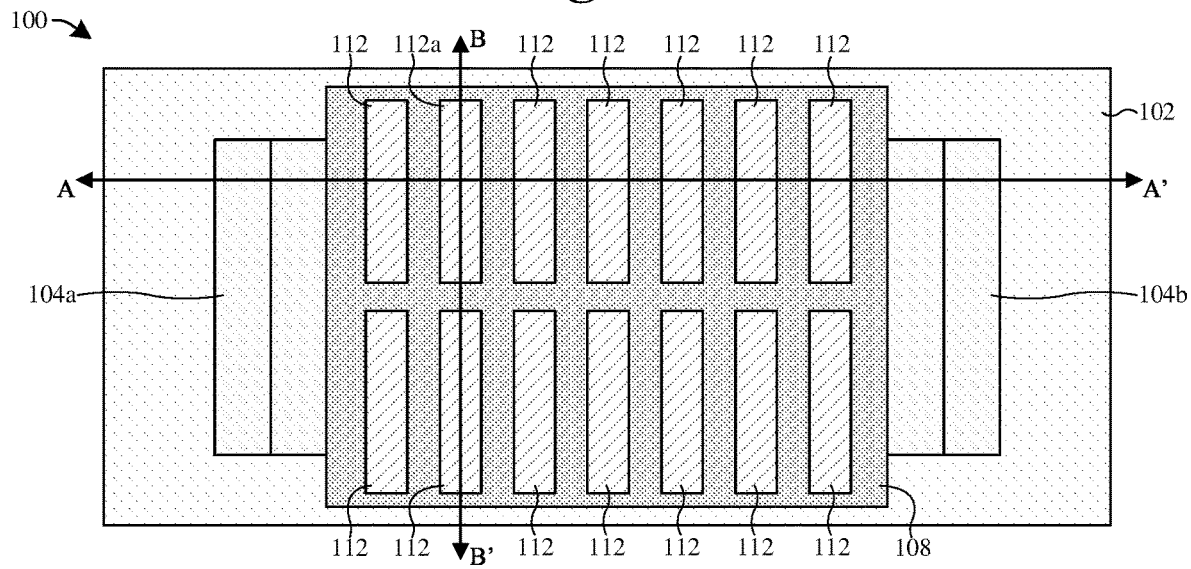
Figure 3C:
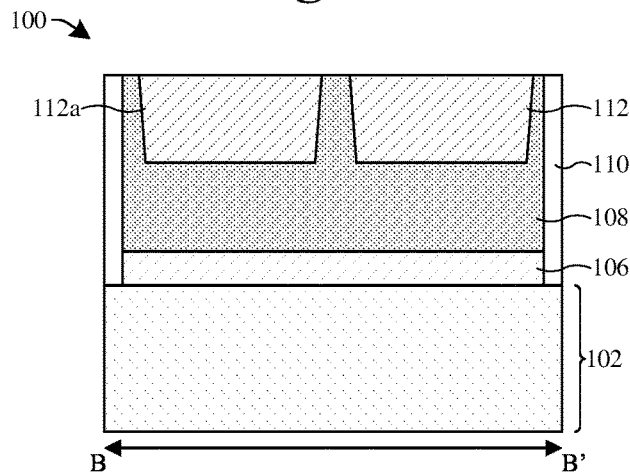

FIGS. 3A-3C illustrate various views of some other embodiments of the semiconductor device 100 of FIGS. 1A-1C. FIG. 3A illustrates a cross-sectional view of the semiconductor device 100 of FIG. 3B taken along line A-A'. FIG. 3B illustrates a top-view of some other embodiments of the semiconductor device 100 of FIG. 1B without the ILD structure 110. FIG. 3C illustrates a cross-sectional view of the semiconductor device 100 of FIG. 3B taken along line B-B'.

As shown in FIGS. 3A-3C, the first pair of opposite sidewalls may be angled. For example, the first pair of opposite sidewalls may extend vertically from the bottom surface of the first dishing prevention structure 112a at opposite angles. In some embodiments, the first pair of opposite sidewalls may be angled and may be joined to the substantially planar bottom surface of the first dishing prevention structure 112a at an angle (e.g., an obtuse/acute angle). In other embodiments, the first pair of opposite sidewalls may be angled and may be joined to the substantially planar bottom surface of the first dishing prevention structure 112a by rounded corners.

Also shown in FIGS. 3A-3C, the source/drain regions 104a-b are disposed at least partially above the semiconductor substrate 102. In such embodiments, the source/drain regions 104a-b may be epitaxial source/drain regions (e.g., formed by an epitaxial process) comprising an epitaxial material. In further such embodiments, the source/drain regions 104a-b and the semiconductor substrate 102 may comprise a same material (e.g., Si). In other such embodiments, the source/drain regions 104a-b and the semiconductor substrate may comprise a different material (e.g., Si and SiGe). In yet further such embodiments, the source/drain regions 104a-b may have a substantially diamond-shaped cross-section. In further embodiments, the source/drain regions 104a-b may be spaced apart by about 10 um. In other embodiments, the source/drain regions 104a-b may be spaced apart by less than or greater than about 10 um.

Figure 4A:
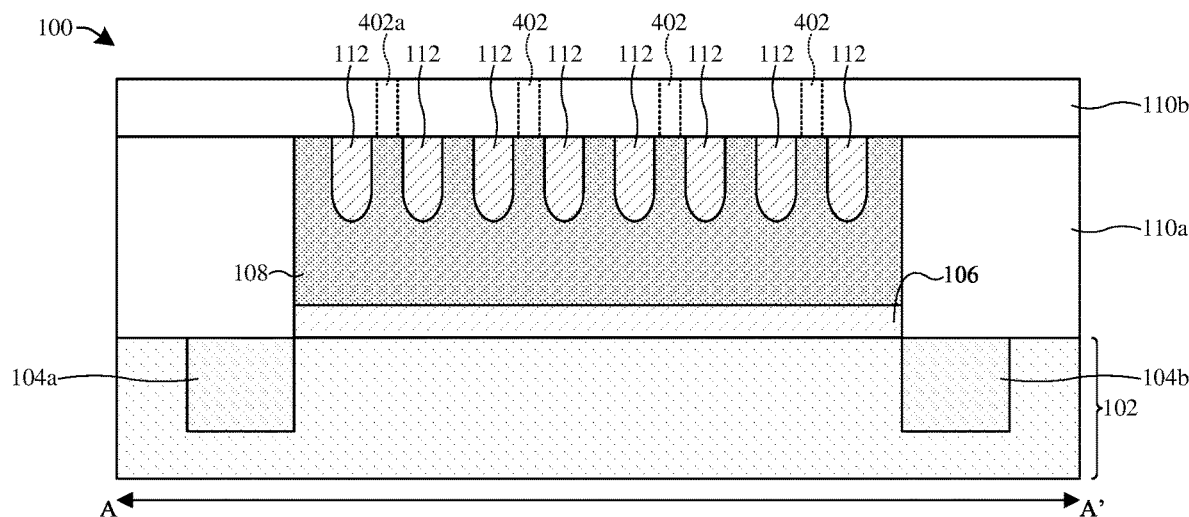
FIGS. 4A-4B illustrate various views of some other embodiments of the semiconductor device of FIGS. 1A-1C.
Figure 4B:
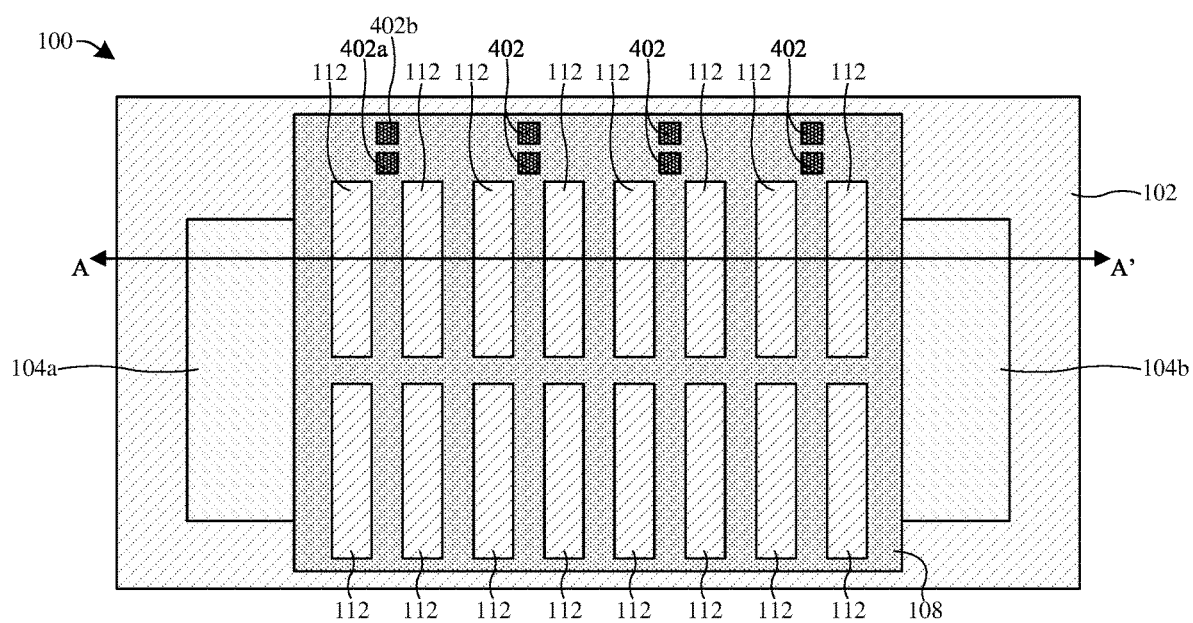

FIGS. 4A-4B illustrate various views of some other embodiments of the semiconductor device 100 of FIGS. 1A-1C. FIG. 4A illustrates a cross-sectional view of the semiconductor device 100 of FIG. 4B taken along line A-A'. FIG. 4B illustrates a top-view of some other embodiments of the semiconductor device 100 of FIG. 1B without the ILD structure 110.

As shown in FIGS. 4A-4B, in some embodiments, the ILD structure 110 comprises a lower ILD structure 110a and an upper ILD structure 110b. The lower ILD structure 110a is disposed over the semiconductor substrate 102 and around both the gate electrode 108 and the gate dielectric 106. In some embodiments, the lower ILD structure 110a comprises one or more ILD layers, which may respectively comprise a low-k dielectric (e.g., a dielectric material with a dielectric constant less than about 3.9), an oxide (e.g., $SiO_2$), or the like. In further embodiments, the lower ILD structure 110a has an upper surface that is co-planar with an upper surface of the gate electrode 108 and/or the dishing prevention structures 112.

The upper ILD structure 110b is disposed over the lower ILD structure 110a, the gate electrode 108, and the dishing prevention structures 112. In some embodiments, the upper ILD structure 110b contacts the lower ILD structure 110a, the gate electrode 108, and the dishing prevention structures 112. In some embodiments, the upper ILD structure 110b comprises one or more ILD layers, which may respectively comprise a low-k dielectric (e.g., a dielectric material with a dielectric constant less than about 3.9), an oxide (e.g., $SiO_2$), or the like.

A plurality of conductive gate contacts 402 are electrically coupled to the gate electrode 108 and disposed in the upper ILD structure 110b. In some embodiments, each of the conductive gate contacts 402 are spaced from each of the dishing prevention structures 112. In other embodiments, one or more of the conductive gate contacts 402 may overlap and/or contact a portion of one or more of the dishing prevention structures 112. In further embodiments, the conductive gate contacts 402 extend vertically from the gate electrode 108 and completely through the upper ILD structure 110b. In yet further embodiments, the conductive gate contacts 402 may comprise, for example, W, Ti, Al, or the like.

In some embodiments, the plurality of conductive gate contacts 402 are disposed in a peripheral region of the gate electrode 108 (e.g., end-cap region). The peripheral region of the gate electrode 108 is adjacent a central region of the gate electrode 108. In further embodiments, each of the dishing prevention structures 112 are disposed in the central region of the gate electrode 108 and each of the conductive gate contacts 402 are disposed in the peripheral region of the gate electrode 108. In further embodiments, opposite sides of the source/drain regions 104a-b may be disposed within opposite sides of the central region of the gate electrode 108. In yet further embodiments, the peripheral region may be disposed directly over an underlying isolation structure (e.g., shallow trench isolation (STI) structure) that is disposed in the semiconductor substrate 102.

In some embodiments, the conductive gate contacts 402 may be disposed between neighboring dishing prevention structures 112. For example, a first conductive gate contact 402a and/or a second conductive gate contact 402b may be disposed between two neighboring dishing prevention structures 112. In some embodiments, the first conductive gate contact 402a and the second conductive gate contact 402b are substantially aligned in a lateral direction. (e.g., in a column). In further embodiments, the first conductive gate contact 402a may be substantially aligned in a lateral direction with other conductive gate contacts 402 (e.g., in a row).

In some embodiments, the first conductive gate contact 402a and/or the second conductive gate contact 402b may be disposed closer to a first sidewall of the gate electrode 108 than each of the dishing prevention structures 112. In further embodiments, the first sidewall of the gate electrode 108 is opposite a second sidewall of the gate electrode 108. In yet further embodiments, the first sidewall and the second sidewall of the gate electrode 108 are spaced apart in a lateral direction that is perpendicular to a lateral direction in which the source/drain regions 104a-b are spaced.

Figure 5:
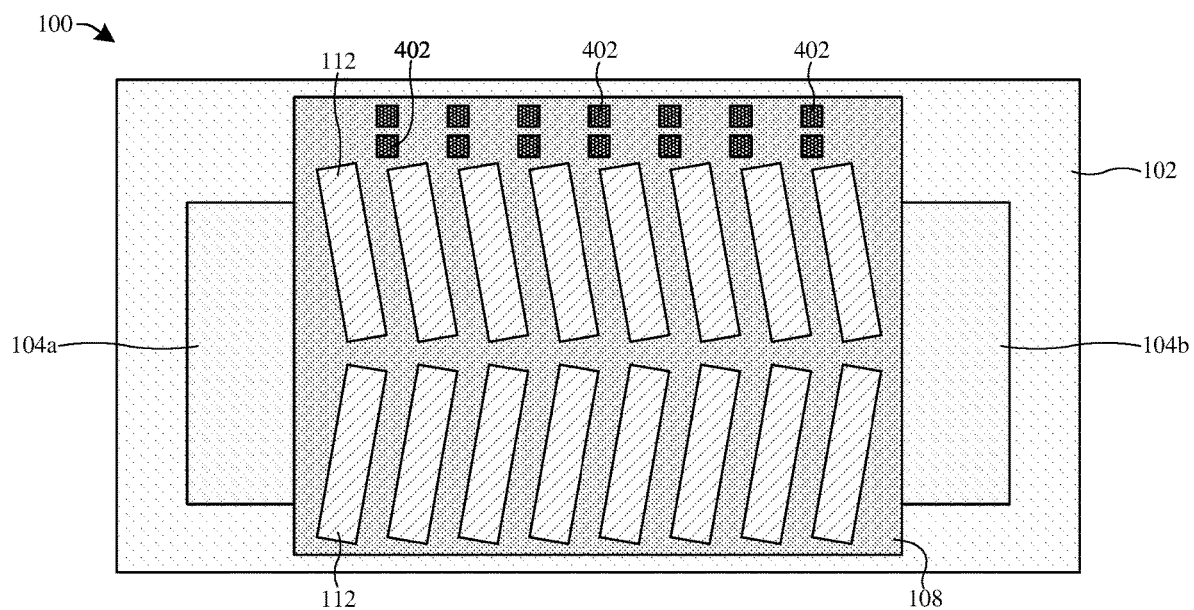
FIG. 5 illustrates a top-view of some other embodiments of the semiconductor device of FIG. 1B without an ILD structure.

FIG. 5 illustrates a top-view of some other embodiments of the semiconductor device 100 of FIG. 1B without the ILD structure 110. For ease of illustration, only some of the conductive gate contacts 402 and some of the dishing prevention structures 112 are labeled in FIG. 5.

As shown in FIG. 5, the dishing prevention structures 112 may be embedded in the gate electrode 108 at an angle (e.g., 15 degree, 30 degree, 60 degree, etc.). In some embodiments, some of the dishing prevention structures 112 disposed in a first row are angled at the same first degree (e.g., positive 10 degree). In further embodiments, some other of the dishing prevention structures 112 disposed in a second row are angled at a same second angle. In further embodiments, the first angle and the second angle are substantially the same. In further embodiments, the first angle and the second angle are different. In yet further embodiments, the first angle and the second angle are opposite one another (e.g., positive 10 degree and negative 10 degree).

Figure 6:
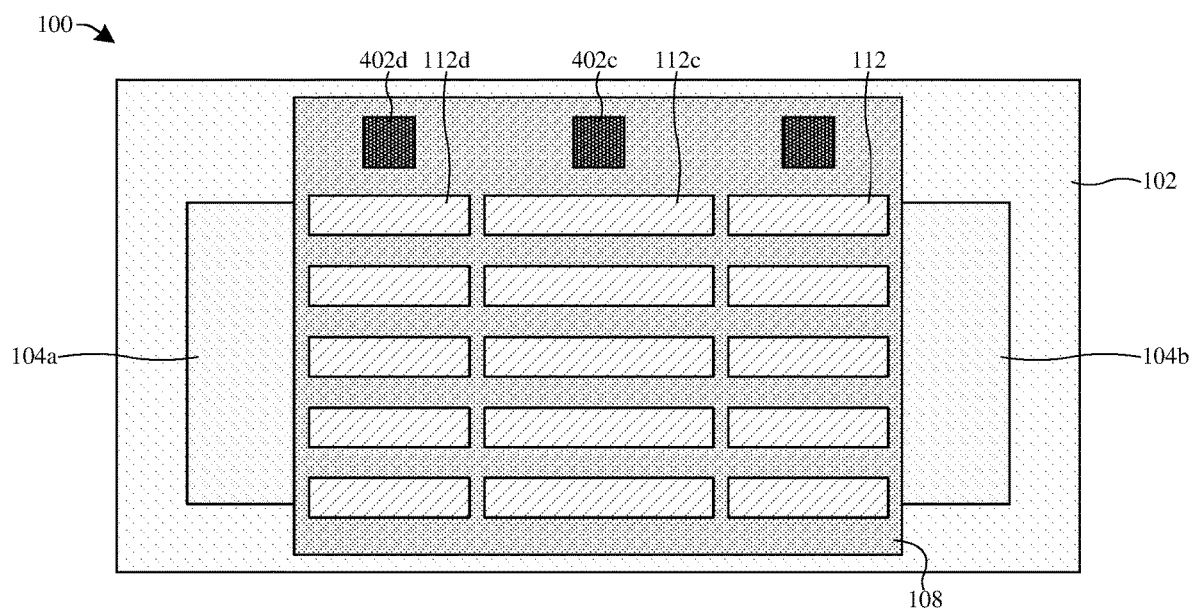
FIG. 6 illustrates a top-view of some other embodiments of the semiconductor device of FIG. 5.

FIG. 6 illustrates a top-view of some other embodiments of the semiconductor device 100 of FIG. 5.

As shown in FIG. 6, some of the dishing prevention structures 112 may have a different length than some other of the dishing prevention structures 112. For example, a length of a third dishing prevention structure 112c is greater than a length of a fourth dishing prevention structure 112d. In further embodiments, the third dishing prevention structure 112c may have a different width and/or geometrical shape than the fourth dishing prevention structure 112d. An area (e.g., length times width) of the third dishing prevention structure 112c may be different than an area of the fourth dishing prevention structure 112d.

In some embodiments, the conductive gate contacts 402 may be disposed between opposite sidewalls of the dishing prevention structures 112, respectively. For example, a third conductive gate contact 402c may be disposed between opposite sidewalls of the third dishing prevention structure 112c, and a fourth conductive gate contact 402d may be disposed between opposite sidewalls of the fourth dishing prevention structure 112d. In further embodiments, one or more of the conductive gate contacts 402 may have a width and/or a length that is different than (e.g., greater than) a width and/or length of one or more of the dishing prevention structures 112.

Figure 7:
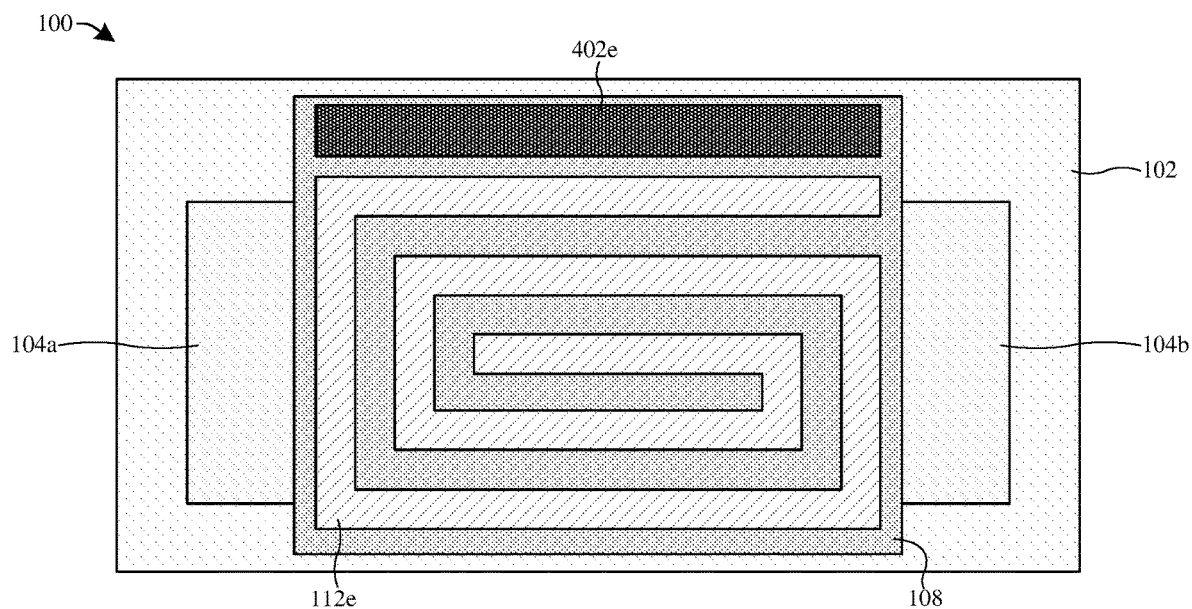
FIG. 7 illustrates a top-view of some other embodiments of the semiconductor device of FIG. 5.

FIG. 7 illustrates a top-view of some other embodiments of the semiconductor device 100 of FIG. 5.

As shown in FIG. 7, in some embodiments, only a single dishing prevention structure may be embedded in the gate electrode 108. For example, only a fifth dishing prevention structure 112e may be embedded in the gate electrode 108.

In some embodiments, the fifth dishing prevention structure 112e may have a spiral shaped layout. In further embodiments, only a single conductive gate contact may be electrically coupled to the gate electrode 108. For example, only a fifth conductive gate contact 402e may be electrically coupled to the gate electrode 108.

Figure 8:
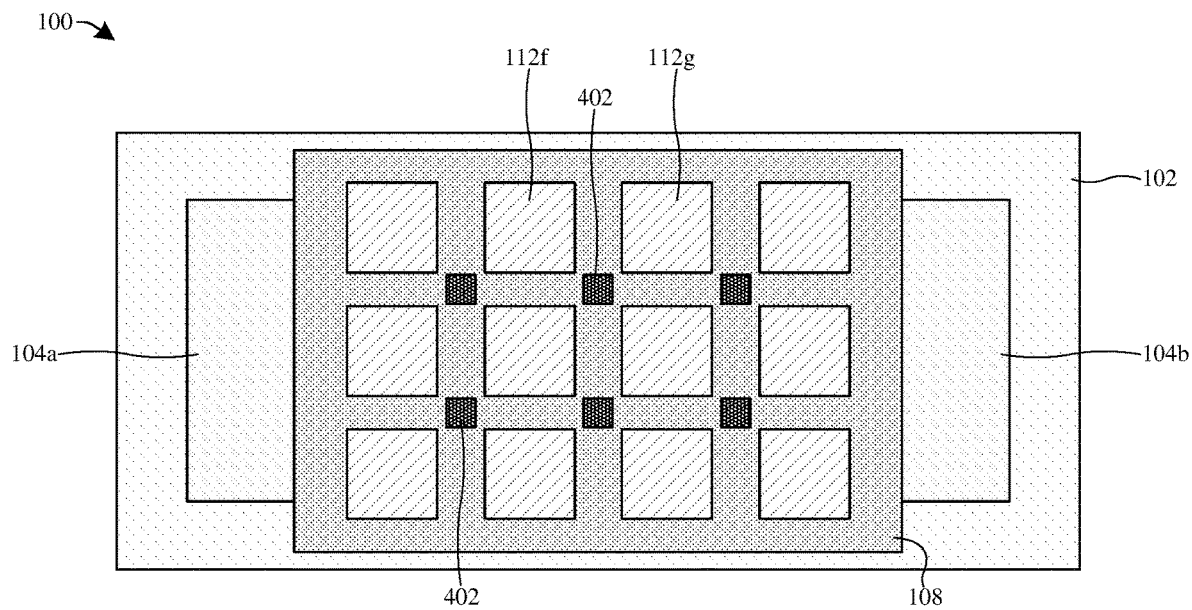
FIG. 8 illustrates a top-view of some other embodiments of the semiconductor device of FIG. 5.

FIG. 8 illustrates a top-view of some other embodiments of the semiconductor device 100 of FIG. 5.

As shown in FIG. 8, the conductive gate contacts 402 may be disposed in the central region of the gate electrode 108. In some embodiments, some of the conductive gate contacts 402 may be disposed in the central region of the gate electrode 108 while some other conductive gate contacts 402 are disposed in the peripheral region of the gate electrode 108. In further embodiments, one or more of the conductive gate contacts 402 may be disposed between opposite sidewalls of the source/drain regions 104a-b.

In some embodiments, each of the dishing prevention structures 112 may have a same area. For example, an area (e.g., length times width) of a sixth dishing prevention structure 112f may be substantially the same as an area of a seventh dishing prevention structure 112g. In further embodiments, sidewalls of the dishing prevention structures 112 may be aligned in a lateral direction. For example, opposite sidewalls of the sixth dishing prevention structure 112f may be substantially aligned with opposite sidewalls of the seventh dishing prevention structure 112g in a lateral direction, respectively.

Figure 9:
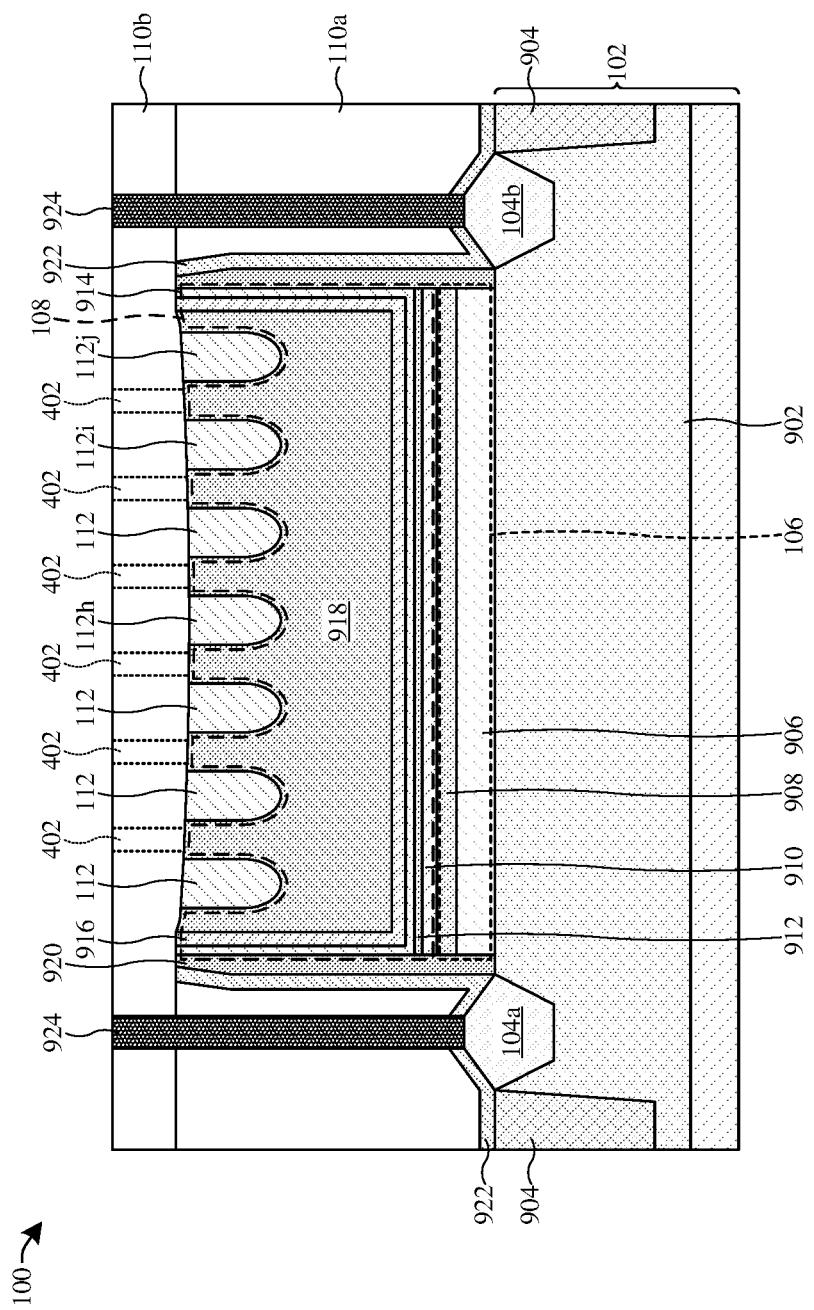
FIG. 9 illustrates a cross-sectional view of some more detailed embodiments of the semiconductor device of FIGS. 4A-4B.

FIG. 9 illustrates a cross-sectional view of some more detailed embodiments of the semiconductor device 100 of FIGS. 4A-4B.

As shown in FIG. 9, a first doped region 902 is disposed in the semiconductor substrate 102. The first doped region 902 is a region of the semiconductor substrate 102 having a second doping type opposite the first doping type (e.g., opposite the doping type of the source/drain regions 104a-b). An isolation structure 904 is disposed in the semiconductor substrate 102. In some embodiments, the isolation structure 904 may be a shallow trench isolation (STI) structure or the like.

In some embodiments, the gate dielectric 106 comprises a first dielectric structure 906 and a second dielectric structure 908 disposed on the first dielectric structure 906. The first dielectric structure 906 may comprise an oxide (e.g., $SiO_2$), and the second dielectric structure may comprise a high-k dielectric ($HfO_2$, $ZrO_2$, etc.). In further embodiments, a height of the first dielectric structure 906 may be greater than a height of the second dielectric structure 908.

In some embodiments, the gate electrode 108 may comprise a first conductive structure 910, a second conductive structure 912, a third conductive structure 914, a fourth conductive structure 916, and a fifth conductive structure 918. The fourth conductive structure 916 may line a bottom surface and sidewalls of the fifth conductive structure 918. The third conductive structure 914 may line a bottom surface and sidewalls of the fourth conductive structure 916. The second conductive structure 912 may be disposed along a bottom surface of the third conductive structure 914. The first conductive structure 910 may be disposed along a bottom surface of the second conductive structure 912. In some embodiments, the first conductive structure 910 contacts both the second conductive structure 912 and the gate dielectric 106. In some embodiments, the dishing prevention structures 112 may be vertically spaced from the first conductive structure 910, the second conductive structure 912, the third conductive structure 914, and/or the fourth conductive structure 916.

In some embodiments, the first conductive structure 910 may comprise, for example, titanium nitride (TiN), tantalum nitride (TaN), titanium-aluminum (TiAl), or the like. The second conductive structure 912 may comprise, for example, TaN, TiN, TiAl, or the like. In some embodiments, the second conductive structure 912 has a different chemical composition than the first conductive structure 910 (e.g., TaN and TiN, respectively). The third conductive structure 914 may comprise, for example, TiN, TaN, TiAl, or the like. In some embodiments, the third conductive structure 914 has a same chemical composition as the first conductive structure 910 (e.g., TiN). The fourth conductive structure 916 may comprise, for example, TiAl, TaN, TiN, or the like. In some embodiments, the fourth conductive structure 916 has a different chemical composition than both the first conductive structure 910 and the second conductive structure 912. The fifth conductive structure 918 may comprise, for example, W, Al, Ti, Mo, some other metal, or a combination of the foregoing. In further embodiments, the fifth conductive structure 918 has a CMP removal rate greater than the dishing prevention structures 112. In yet further embodiments, a CMP removal rate of the fourth conductive structure 916 and/or the third conductive structure 914 may be different than (e.g., less than) the CMP removal rate of the fifth conductive structure 918.

A sidewall spacer 920 may be disposed over the semiconductor substrate 102 and along sidewalls of the gate electrode 108 and sidewalls of the gate dielectric 106. In some embodiments, portions of outer sidewalls of the sidewall spacer 920 angle in toward the gate electrode 108. The sidewall spacer 920 may have an upper surface that is substantially co-planar with an upper surface of the lower ILD structure 110a. In further embodiments, the sidewall spacer 920 is spaced from the dishing prevention structures 112. In yet further embodiments, the sidewall spacer 920, may comprise, for example, a nitride (e.g., SiN), an oxynitride (e.g., $SiO_XN_Y$), some other dielectric material, or a combination of the foregoing.

A contact etch stop layer (CESL) 922 may be disposed over the semiconductor substrate 102, over the source/drain regions 104a-b, and along the outer sidewalls of the sidewall spacer 920. In some embodiments, portions of outer sidewalls of the CESL 922 that extend along the outer sidewalls of the sidewall spacer 920 may angle in toward the gate electrode 108. The CESL 922 may contact the sidewall spacer 920, the source/drain regions 104a-b, and the isolation structure 904. An upper surface of the CESL 922 may be substantially co-planar with an upper surface of the lower ILD structure 110a. In further embodiments, the CESL 922 may comprise, for example, an oxide (e.g., $SiO_2$), a nitride (e.g., SiN), an oxy-nitride (e.g., $SiO_XN_Y$), or the like.

A plurality of conductive source/drain contacts 924 are electrically coupled to the source/drain regions 104a-b and disposed in both the lower ILD structure 110a and the upper ILD structure 110b. In some embodiments, the conductive source/drain contacts 924 are disposed in a different plane than the conductive gate contacts 402. In other embodiments, the conductive source/drain contacts 924 may be disposed in a same plane as the conductive gate contacts 402. In further embodiments, the conductive source/drain contacts 924 may comprise, for example, W, Ti, Al, or the like.

Also shown in FIG. 9, an upper surface of the fifth conductive structure 918 and upper surfaces of the dishing prevention structures 112 form a concave like surface. In some embodiments, heights of the dishing prevention structures 112 increase as the dishing preventions structures are disposed closer to the sidewalls of the gate electrode 108. For example, a height of an eighth dishing prevention structure 112h may be less than a height of a ninth dishing prevention structure 112i, and the height of the ninth dishing prevention structure 112i may be less than a height of a tenth dishing prevention structure 112j. In further embodiments, a portion of the tenth dishing prevention structure 112j may be disposed above an uppermost surface of the ninth dishing prevention structure 112i, and a portion of the ninth dishing prevention structure 112i may be disposed above an uppermost surface of the eighth dishing prevention structure 112h. In yet further embodiments, a center point of the upper surface of the fifth conductive structure 918 is disposed beneath a different point of the upper surface of the fifth conductive structure 918 that is disposed closer to an outer sidewall of the fifth conductive structure 918.

Figure 10:
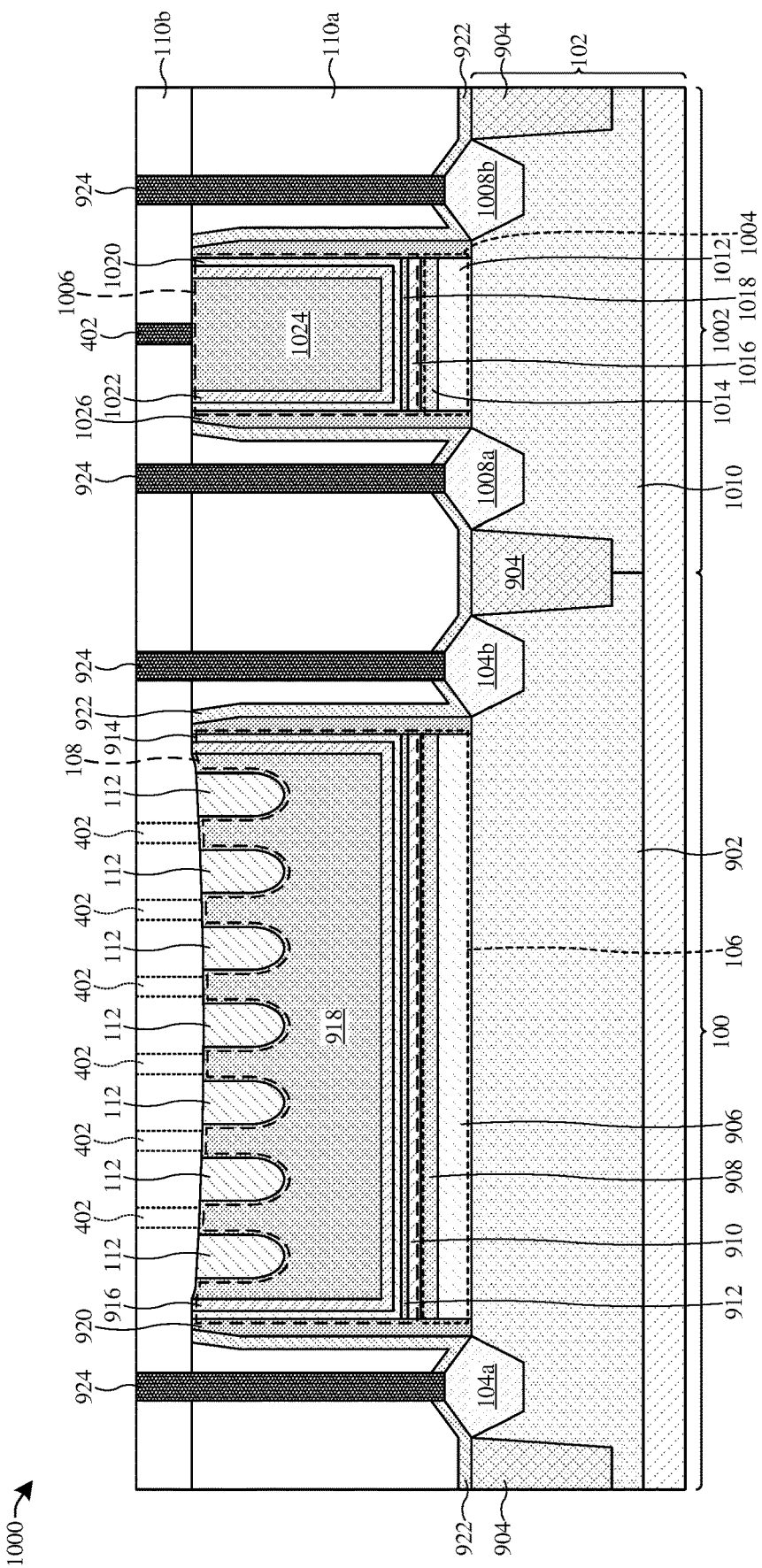
FIG. 10 illustrates a cross-sectional view of some embodiments of an integrated chip (IC) comprising some embodiments of the semiconductor device of FIG. 9 and a second semiconductor device.

FIG. 10 illustrates a cross-sectional view of some embodiments of an integrated chip (IC) 1000 comprising some embodiments of the semiconductor device 100 of FIG. 9 and a second semiconductor device 1002.

As shown in FIG. 10, the second semiconductor device 1002 comprises a second gate dielectric 1004 and a second gate electrode 1006 disposed on the second gate dielectric 1004. In some embodiments, the second semiconductor device 1002 (e.g., logic MOSFET) has a different operating voltage than the semiconductor device 100 (e.g., a high-voltage MOSFET). A second pair of source/drain regions 1008a-b are disposed in the semiconductor substrate 102 and on opposite sides of the second gate dielectric 1004. In further embodiments, a length of the second gate electrode 1006 and/or the second gate dielectric 1004 is different than (e.g., less than) the length of the gate electrode 108 and/or the gate dielectric 106, respectively. In yet further embodiments, a width of the second gate electrode 1006 and/or the second gate dielectric 1004 is different than (e.g., less than) the width of the gate electrode 108 and/or the gate dielectric 106, respectively.

A second doped region 1010 is disposed in the semiconductor substrate 102. In some embodiments, the second doped region 1010 has a same doping type as the first doped region 902. In such embodiments, the second pair of source/drain regions 1008a-b has a same doping type as the pair of source/drain regions 104a-b. In other embodiments, the second doped region 1010 and the first doped region 902 have opposite doping types. In such embodiments, the second pair of source/drain regions 1008a-b and the pair of source/drain regions 104a-b have opposite doping types.

In some embodiments, the second gate dielectric 1004 comprises a third dielectric structure 1012 and a fourth dielectric structure 1014 disposed on the third dielectric structure 1012. The third dielectric structure 1012 and the fourth dielectric structure 1014 may have a same chemical composition as the first dielectric structure 906 and the second dielectric structure 908, respectively. In further embodiments, the second gate electrode 1006 comprises a sixth conductive structure 1016, a seventh conductive structure 1018, an eighth conductive structure 1020, a ninth conductive structure 1022, and a tenth conductive structure 1024. In yet further embodiments, a chemical composition of the sixth conductive structure 1016, the seventh conductive structure 1018, the eighth conductive structure 1020, the ninth conductive structure 1022, and the tenth conductive structure 1024 may be the same as a chemical composition of the first conductive structure 910, the second conductive structure 912, the third conductive structure 914, the fourth conductive structure 916, and the fifth conductive structure 918, respectively.

In some embodiments, a second sidewall spacer 1026 is disposed over the semiconductor substrate 102 and along sidewalls of the second gate electrode 1006 and sidewalls of the second gate dielectric 1004. A chemical composition of the second sidewall spacer 1026 may be the same as a chemical composition of the sidewall spacer 920. In further embodiments, an upper surface of the second sidewall spacer 1026 may be substantially co-planar with an upper surface of the tenth conductive structure 1024.

In some embodiments, the CESL 922 is disposed along sidewalls of the second sidewall spacer 1026 and along the second pair of source/drain regions 1008*a-b*. In further embodiments, one or more conductive gate contacts 402 are electrically coupled to the second gate electrode 1006. In further embodiments, the one or more conductive gate contacts 402 electrically coupled to the second gate electrode 1006 may be disposed in a different plane of the IC 1000 than the conductive gate contacts 402 electrically coupled to the gate electrode 108. In yet further embodiments, some of the conductive source/drain contacts 924 are electrically coupled to the second pair of source/drain regions 1008*a-b*, respectively.

Also shown in FIG. 10, an upper surface of the second gate electrode 1006 may be substantially co-planar with an upper surface of the lower ILD structure 110*a*. In other embodiments, the upper surface of the second gate electrode 1006 may be concave. In such embodiments, a radius of curvature of the concave surface of the second gate electrode 1006 may be less than a radius of curvature of the concave like surface formed by the upper surface of the fifth conductive structure 918 and the upper surfaces of the dishing prevention structures 112. In further embodiments, an uppermost portion of the tenth conductive structure 1024 extends continuously between opposite sidewalls of the tenth conductive structure 1024. In other words, in some embodiments, no dishing prevention structures 112 are disposed in the tenth conductive structure 1024. In yet further embodiments, a portion of the tenth conductive structure 1024 may be disposed over an uppermost surface of each of the dishing prevention structures 112.

Because the semiconductor device 100 and the second semiconductor device 1002 are integrated on the IC 1000 and because the gate electrode 108 may be larger (e.g., greater length/width) than the second gate electrode 1006, a CMP process may cause more severe dishing to the gate electrode 108 than the second gate electrode 1006. Because the dishing prevention structures 112 are embedded in the gate electrode 108 and because the second CMP removal rate is greater than the first CMP removal rate, the dishing prevention structures 112 may reduce an amount of dishing to the gate electrode 108 in relation to an amount of dishing to the second gate electrode 1006. Accordingly, performance of the IC 1000 may be improved (e.g., by improving integration of the semiconductor device 100 and the second semiconductor device 1002) and/or a cost to fabricate the IC 1000 may be reduced.

FIGS. 11-19 illustrate a series of cross-sectional views of some embodiments of a method for forming the IC 1000 of FIG. 10.

Figure 11:
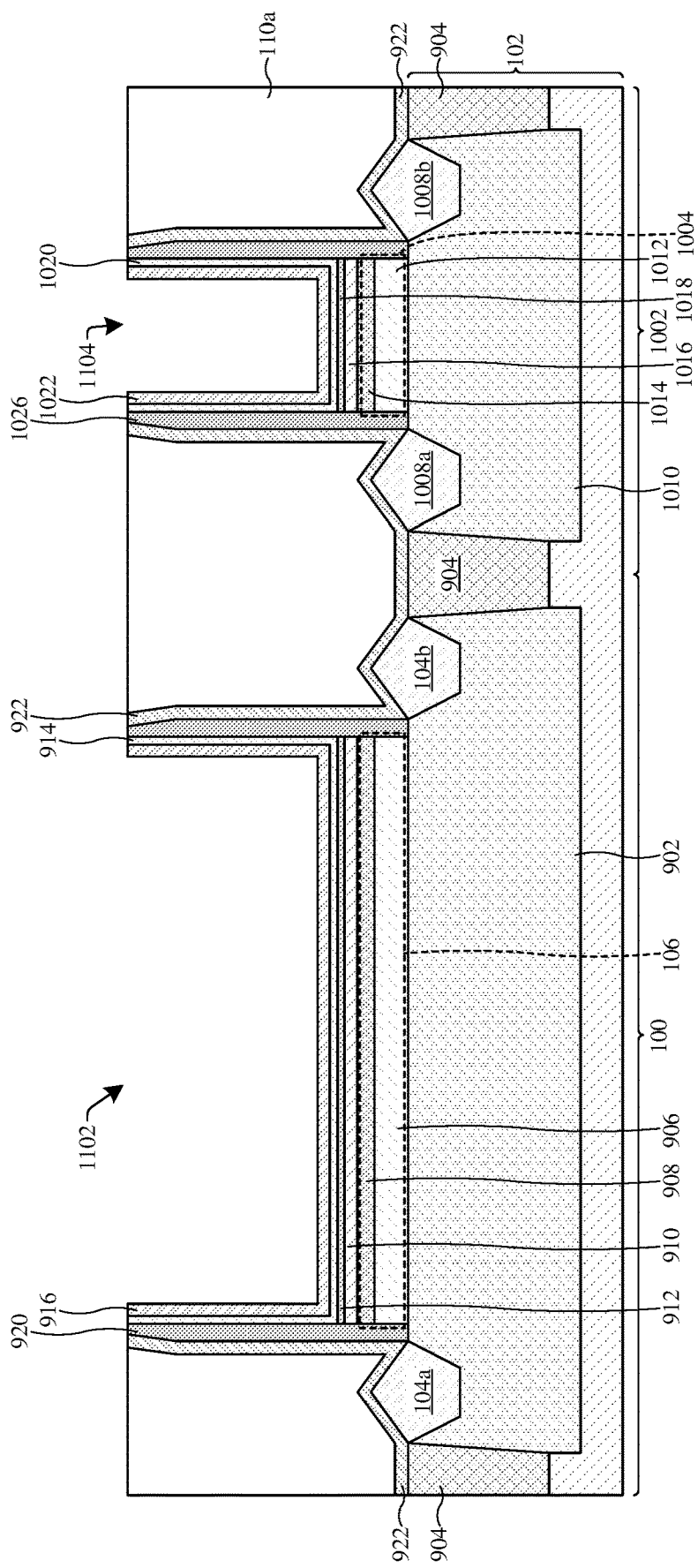
FIGS. 11-18 illustrate a series of cross-sectional views of some embodiments of a method for forming the IC of FIG. 10.

As shown in FIG. 11, a first opening 1102 and a second opening 1104 are disposed in a lower ILD structure 110*a* and over a semiconductor substrate 102. In some embodiments, a method for forming the structure of FIG. 11 may comprise forming an isolation structure 904 in the semiconductor substrate 102 (e.g., via an etching and deposition/growth process). Thereafter, a first doped region 902 and a second doped region 1010 are formed in the semiconductor substrate 102 (e.g., via ion implantation). The gate dielectric 106 and the second gate dielectric 1004 are formed over the semiconductor substrate 102. Thereafter, a first dummy gate electrode (e.g., polysilicon gate) and a second dummy gate electrode are formed on the gate dielectric 106 and the second gate dielectric 1004, respectively. A sidewall spacer 920 is formed over the semiconductor substrate 102 and laterally around both the gate dielectric 106 and the first dummy gate electrode, and a second sidewall spacer 1026 is formed over the semiconductor substrate 102 and laterally around both the second gate dielectric 1004 and the second dummy gate electrode. A pair of source/drain regions 104*a-b* and a second pair of source/drain regions 1008*a-b* are formed in/over the semiconductor substrate (e.g., via an epitaxy process). A CESL 922 is formed on the semiconductor substrate 102, the isolation structure 904, the pair of source/drain regions 104*a-b*, the second pair of source/drain regions 1008*a-b*, the sidewall spacer 920, the second sidewall spacer 1026, the first dummy gate electrode, and the second dummy gate electrode.

An ILD layer is formed covering the CESL 922, the isolation structure 904, the pair of source/drain regions 104*a-b*, the second pair of source/drain regions 1008*a-b*, the sidewall spacer 920, the second sidewall spacer 1026, the first dummy gate electrode, and the second dummy gate electrode. A planarization process (e.g., CMP) is performed into the ILD layer and the CESL 922 to form the lower ILD structure 110*a*. Thereafter, the first dummy gate electrode and the second dummy gate electrode are removed (e.g., via an etching process).

A first conductive layer (not shown) is then deposited over the lower ILD structure 110*a*, on the gate dielectric 106, and on the second gate dielectric 1004, and then the first conductive layer is etched to form a first conductive structure 910 on the gate dielectric 106 and a sixth conductive structure 1016 on the second gate dielectric 1004. A second conductive layer (not shown) is then deposited over the lower ILD structure 110*a*, on the first conductive structure 910, and on the sixth conductive structure 1016, and then the second conductive layer is etched to form a second conductive structure 912 on the first conductive structure 910 and a seventh conductive structure 1018 on the sixth conductive structure 1016. A third conductive layer (not shown) is then deposited over the lower ILD structure 110*a*, on the second conductive structure 912, and on the seventh conductive structure 1018. The third conductive layer is then etched to form a third conductive structure 914 on the second conductive structure 912 and along inner sidewalls of the sidewall spacer 920 and to form an eighth conductive structure 1020 on the seventh conductive structure 1018 and along inner sidewalls of the second sidewall spacer 1026.

A fourth conductive layer (not shown) is then deposited on the third conductive structure 914 and on the eighth conductive structure 1020, and then the fourth conductive layer is etched to form a fourth conductive structure 916 lining the third conductive structure 914 and a ninth conductive structure 1022 lining the eighth conductive structure 1020. It will be appreciated that, in some embodiments, the fourth conductive layer may be deposited on the third conductive layer, and a planarization process may be performed into the third conductive layer and the fourth conductive layer to form the fourth conductive structure 916, the third conductive structure 914, the ninth conductive structure 1022, and the eighth conductive structure 1020. In some embodiments, the above layers and/or structures may be formed using a deposition or growth process such as, for example, chemical vapor deposition (CVD), physical vapor deposition (PVD), atomic layer deposition (ALD), thermal oxidation, sputtering, electrochemical plating, electroless plating, some other deposition or growth process, or a combination of the foregoing.

Figure 12:
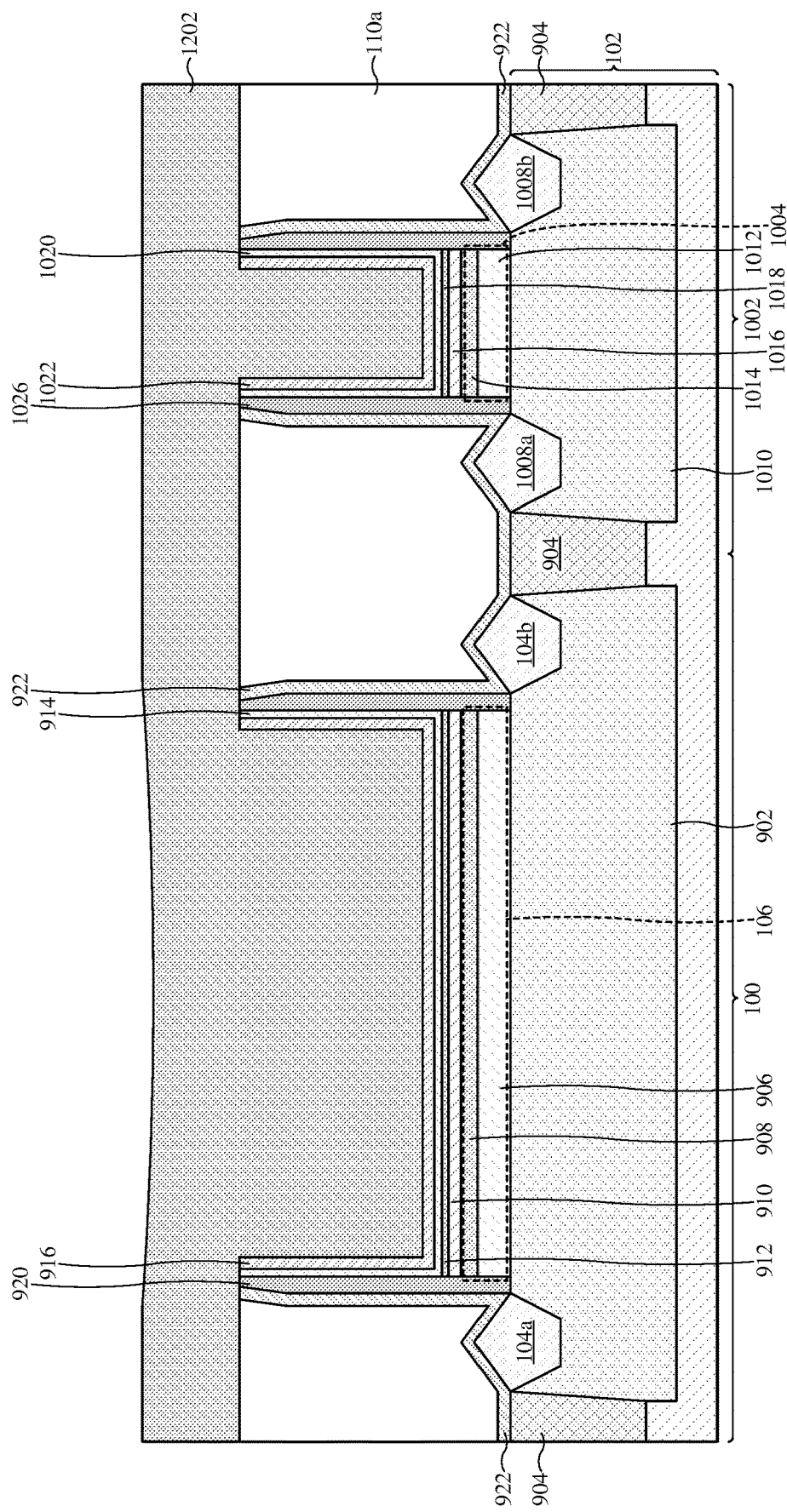

As shown in FIG. 12, a conductive layer 1202 is formed over the lower ILD structure 110a and in both the first opening 1102 and the second opening 1104 (see, e.g., FIG. 11). In some embodiments, a process for forming the conductive layer 1202 comprises depositing the conductive layer on the lower ILD structure 110a, the CESL 922, the sidewall spacer 920, the third conductive structure 914, the fourth conductive structure 916, the second sidewall spacer 1026, the eighth conductive structure 1020, and the ninth conductive structure 1022. In some embodiments, the conductive layer 1202 may be deposited by, for example, CVD, PVD, ALD, sputtering, electrochemical plating, electroless plating, some other deposition process, or a combination of the foregoing. In further embodiments, the conductive layer 1202 may comprise or be a metal (e.g., W, Al, Ti, Mo, etc.).

Figure 13:
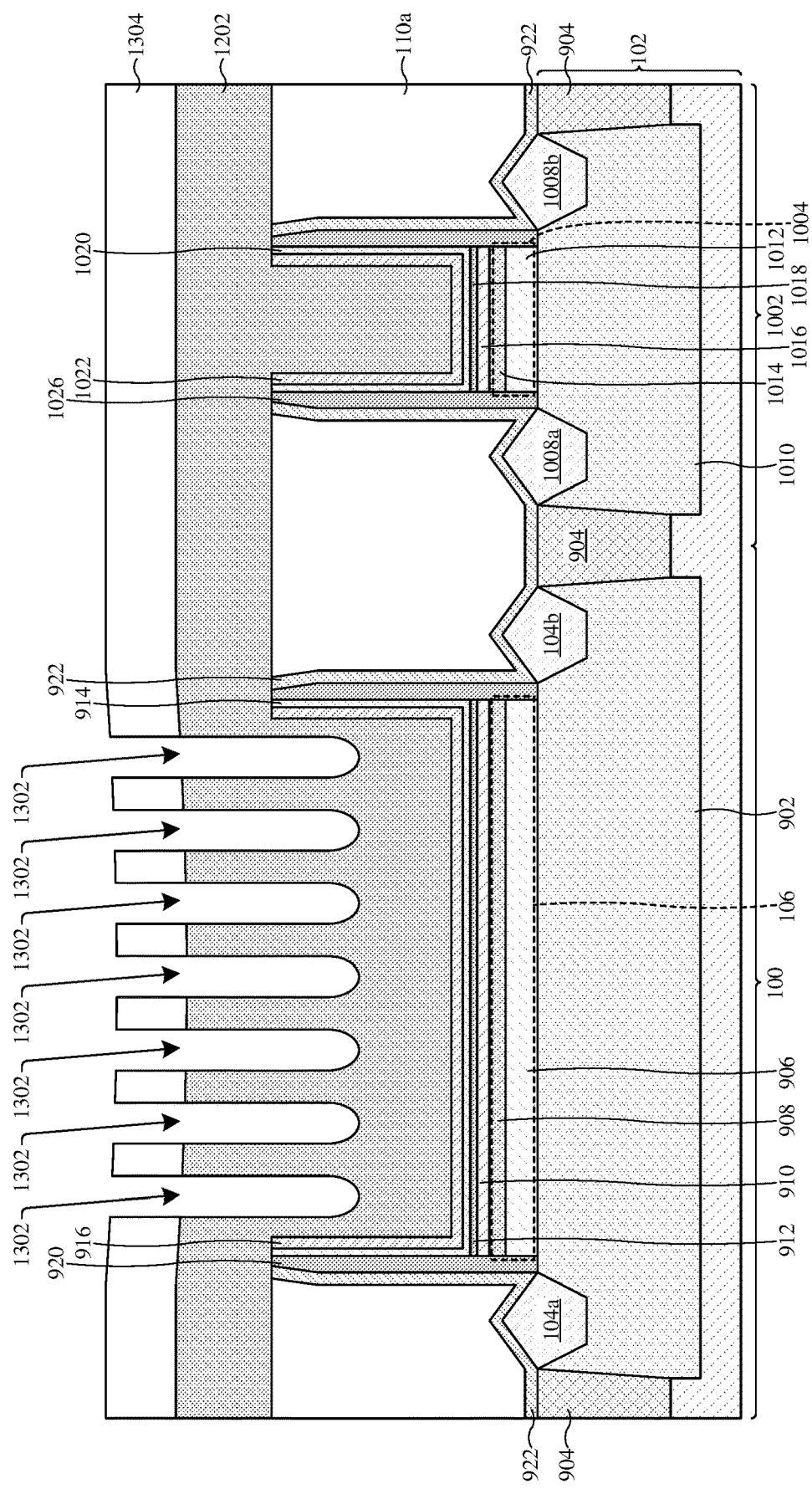

As shown in FIG. 13, a plurality of openings 1302 are formed in the conductive layer 1202. In some embodiments, the openings 1302 are formed within a perimeter of the gate dielectric 106. In further embodiments, the openings 1302 are formed vertically spaced from the gate dielectric 106.

In some embodiments, a process for forming the openings 1302 comprises forming a patterned masking layer 1304 on the conductive layer 1202. In further embodiments, the patterned masking layer 1304 may be formed by a spin-on process (e.g., to deposit the masking layer) and patterned using photolithography (e.g., to pattern the masking layer into the patterned masking layer 1304). In yet further embodiments, the process comprises etching (e.g., via a dry/wet etch process) the conductive layer 1202 with the patterned masking layer 1304 in place, thereby forming the openings 1302. Subsequently, the patterned masking layer 1304 may be stripped away.

Figure 14:
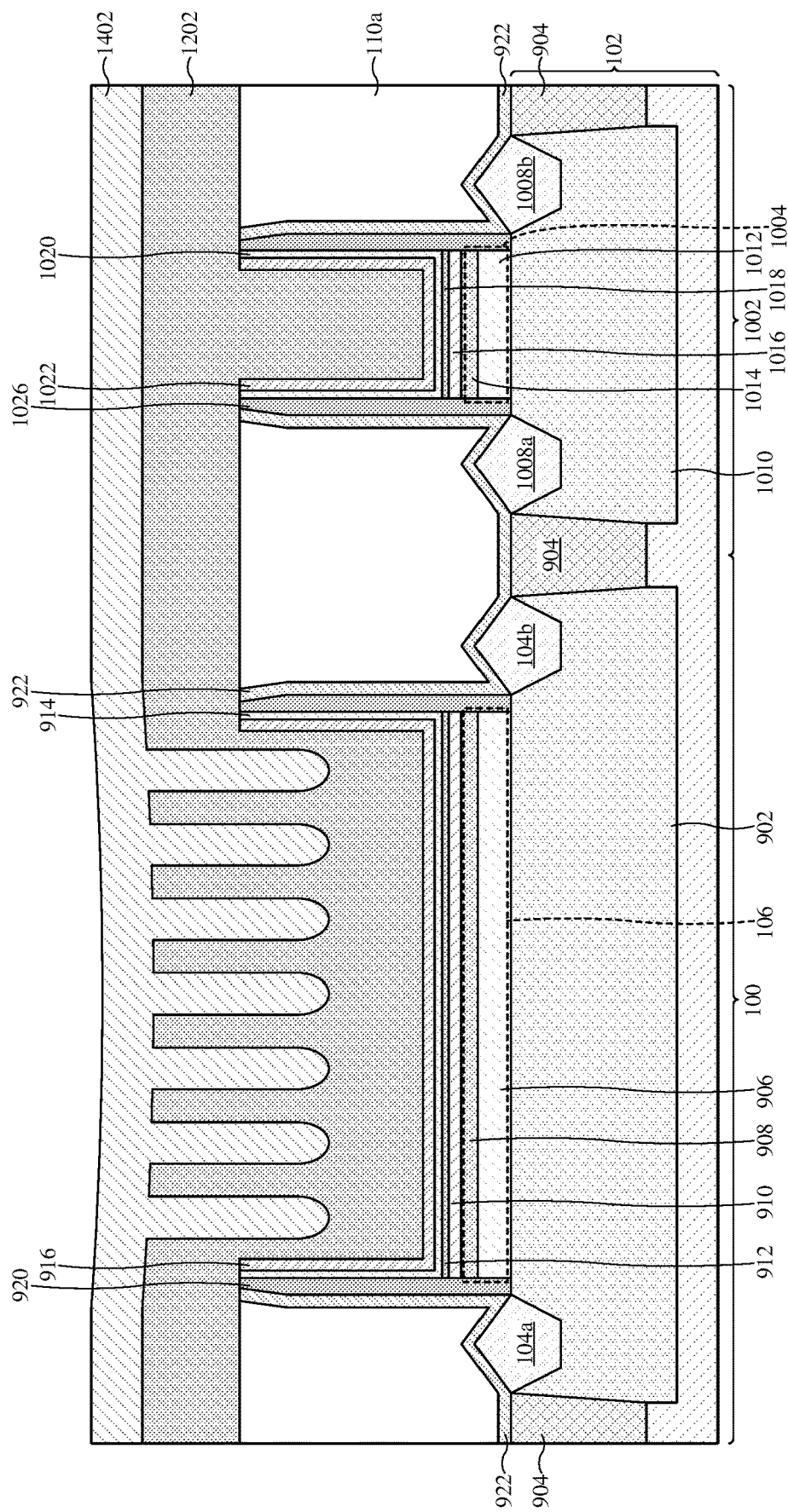

As shown in FIG. 14, a dishing prevention layer 1402 is formed over the conductive layer 1202 and in the openings 1302 (see, e.g., FIG. 13). The dishing prevention layer 1402 has a different CMP removal rate than the conductive layer 1202. In some embodiments, a process for forming the dishing prevention layer 1402 comprises depositing or growing the dishing prevention layer 1402 on the conductive layer 1202 and in the openings 1302. In some embodiments, the dishing prevention layer 1402 may be deposited by, for example, CVD, PVD, ALD, thermal oxidation, sputtering, some other deposition or growth process, or a combination of the foregoing. In further embodiments, the dishing prevention layer 1402 may comprise, for example, an oxide (e.g., $SiO_2$), a nitride (e.g., silicon nitride (SiN)), an oxynitride (e.g., silicon oxy-nitride ($SiO_XN_Y$)), some other material capable of filling the openings 1302 and having a CMP removal rate different than (e.g., less than) the conductive layer 1202, or a combination of the foregoing.

Figure 15:
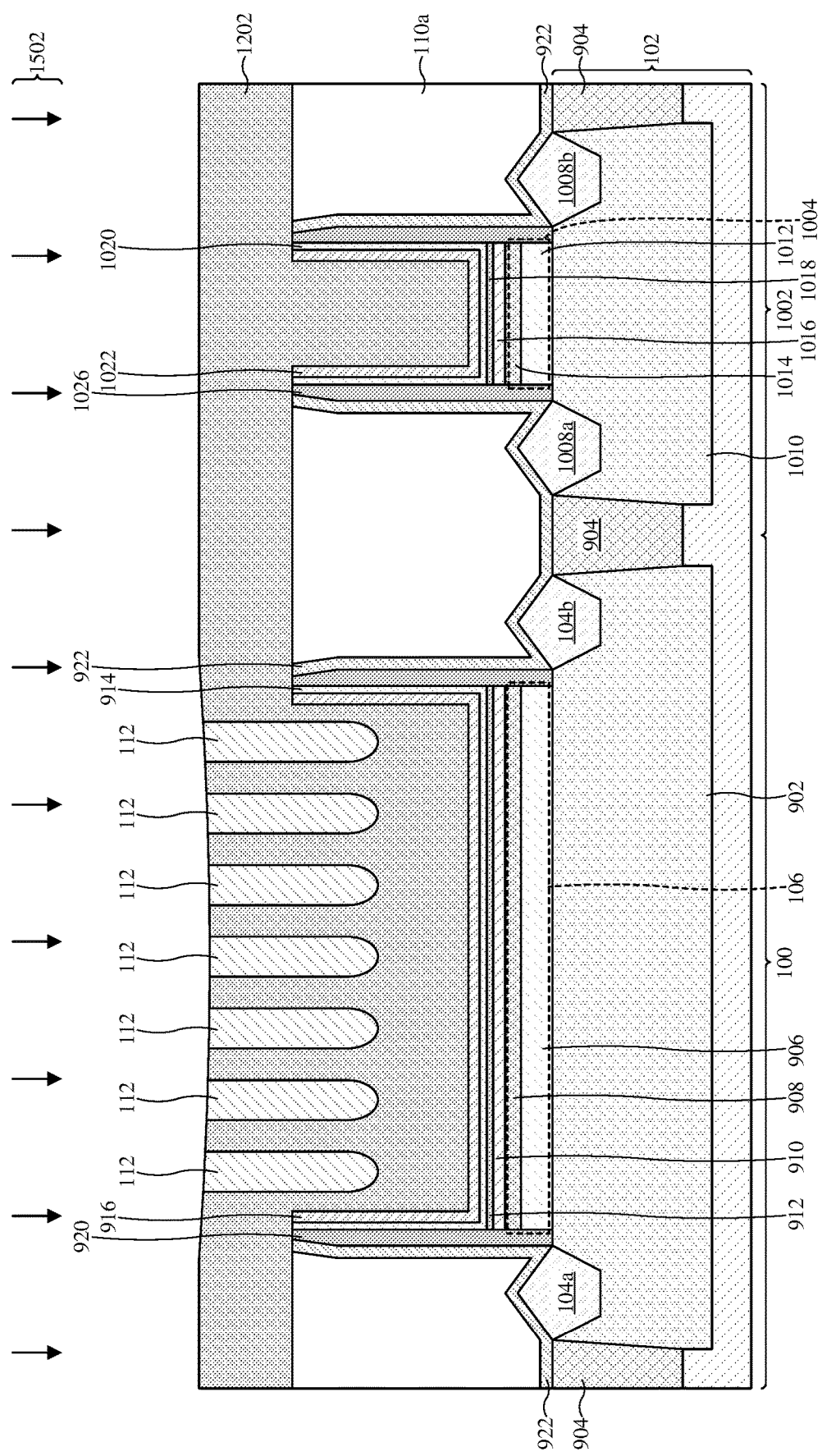

As shown in FIG. 15, a first planarization process 1502 (e.g., CMP) is performed into the dishing prevention layer 1402 (see, e.g., FIG. 14) to form a plurality of dishing prevention structures 112 embedded in the conductive layer 1202. In some embodiments, the first planarization process 1502 may also be performed into the conductive layer 1202. In further embodiments, the first planarization process 1502 is a CMP process. In further embodiments, after the first planarization process 1502, a portion of the dishing prevention layer 1402 (not shown) may be disposed on the conductive layer 1202 and couple together the dishing prevention structures 112. In yet further embodiments, this portion of the dishing prevention layer 1402 may have an upper surface that is co-planar with an upper surface of the conductive layer 1202.

Figure 16:
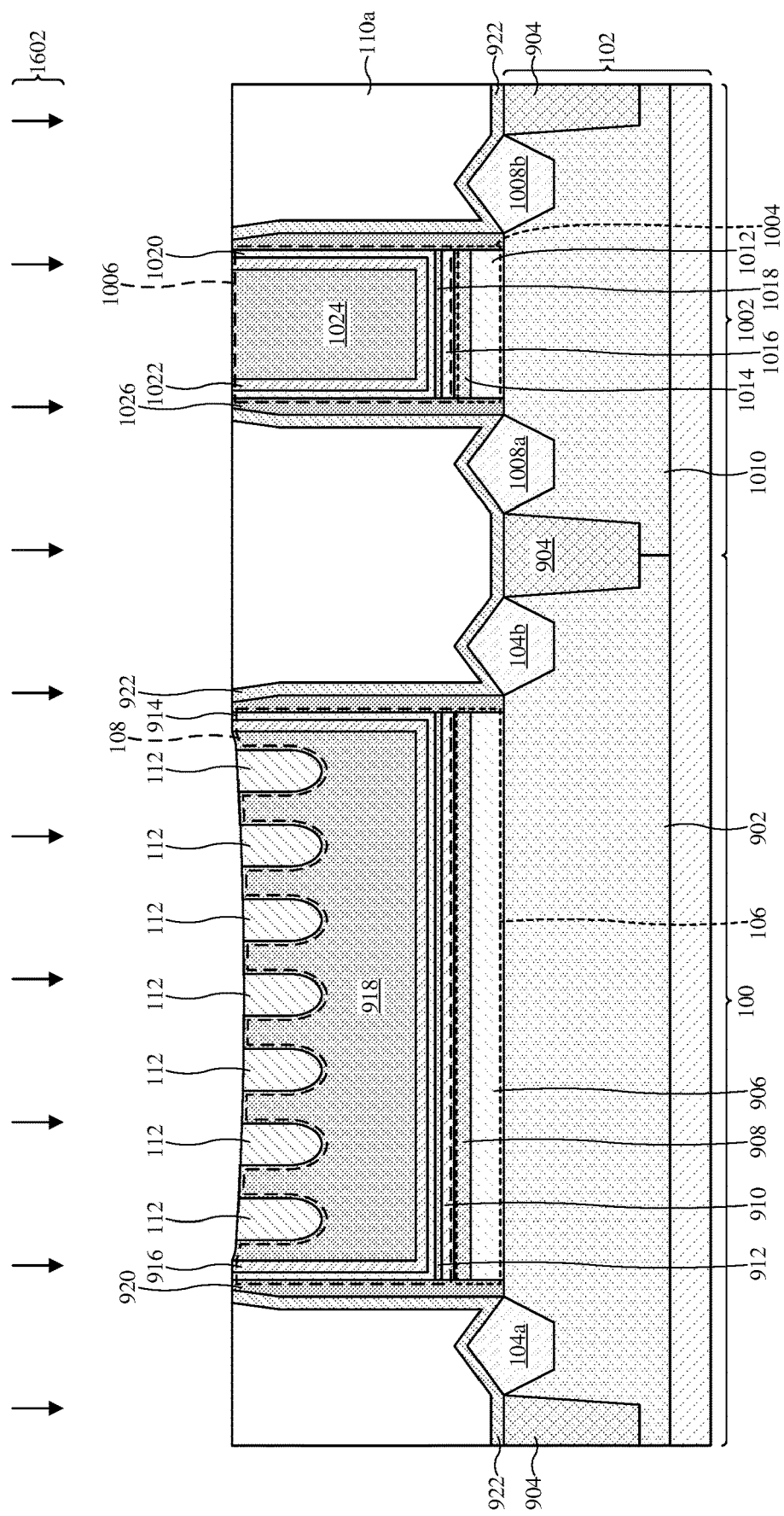

As shown in FIG. 16, a gate electrode 108 is formed over the gate dielectric 106, and a second gate electrode 1006 is formed over the second gate dielectric 1004. In some embodiments, a process for forming the gate electrode 108 and the second gate electrode 1006 comprises performing a second planarization process 1602 (e.g., CMP) into the dishing prevention structures 112 and the conductive layer 1202, thereby forming a fifth conductive structure 918 on the gate dielectric 106 and a tenth conductive structure 1024 on the second gate dielectric 1004. In further embodiments, the second planarization process 1602 may also be performed into the lower ILD structure 110a, the CESL 922, the sidewall spacer 920, the third conductive structure 914, the fourth conductive structure 916, the second sidewall spacer 1026, the eighth conductive structure 1020, and/or the ninth conductive structure 1022.

In some embodiments, the second planarization process 1602 may have different process parameters (e.g., chemical slurry composition, pressure, velocity, time, etc.) than the first planarization process 1502. In further embodiments, the first planarization process 1502 may not be performed. In such embodiments, the second planarization process 1602 may be performed into the dishing prevention layer 1402, which forms the dishing prevention structures 112, and then into the conductive layer 1202 to form the gate electrode 108 and the second gate electrode 1006. In further such embodiments, the second planarization process 1602 may be performed continuously, such that a single planarization process is performed into both the dishing prevention layer 1402 and the conductive layer 1202 until the gate electrode 108 and the second gate electrode 1006 are formed. In yet further embodiments, after the gate electrode 108 and the second gate electrode 1006 are formed, formation of the semiconductor device 100 and the second semiconductor device 1002 may be complete.

Figure 17:
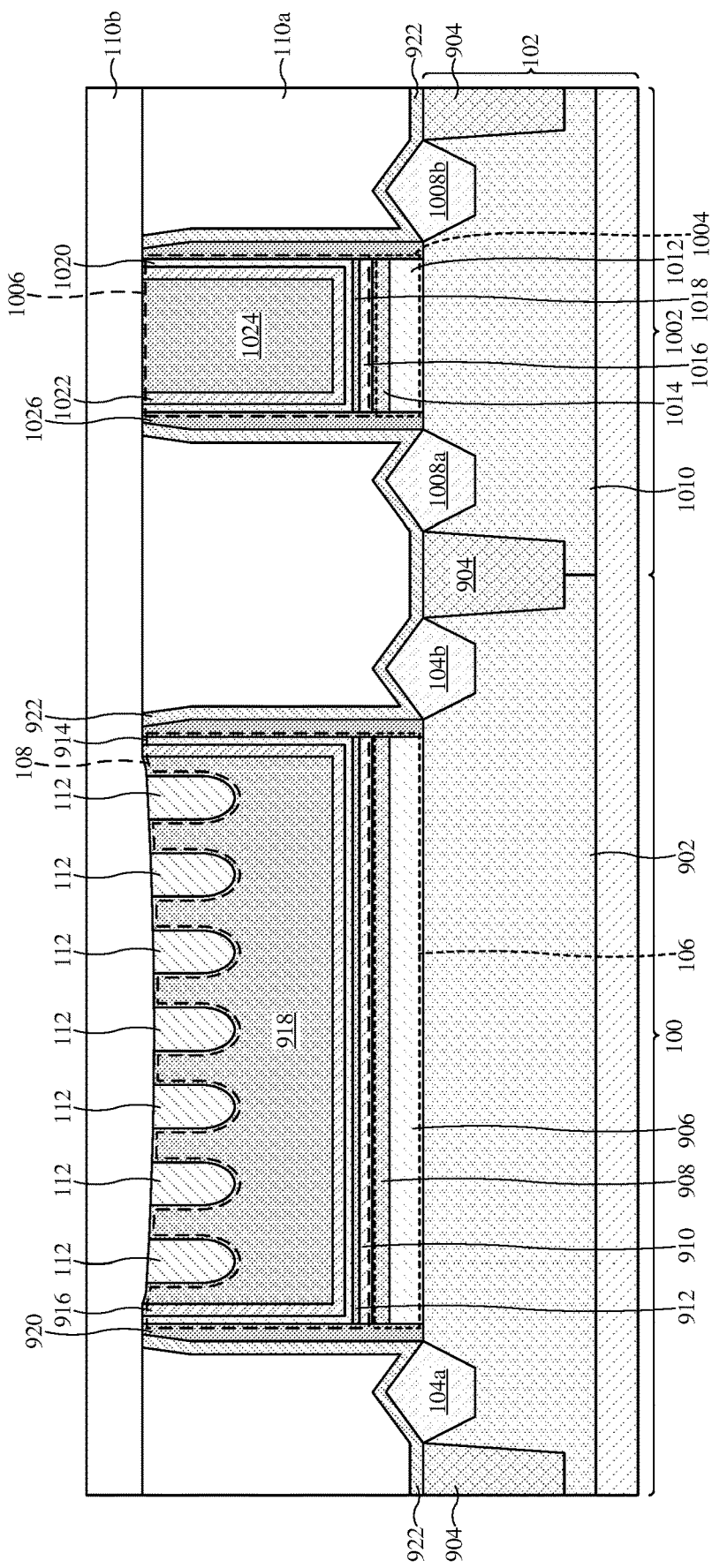

As shown in FIG. 17, an upper ILD structure 110b is formed over the lower ILD structure 110a, the gate electrode 108, the dishing prevention structures 112, and the second gate electrode 1006. In some embodiments, the upper ILD structure 110b may be formed with a substantially planar upper surface. In further embodiments, a process for forming the upper ILD structure 110b comprises depositing an ILD layer on the lower ILD structure 110a, the gate electrode 108, the dishing prevention structures 112, and the second gate electrode 1006. The ILD layer may be deposited by, for example, CVD, PVD, sputtering, or some other deposition process. Thereafter, a planarization process (e.g., CMP) may be performed into the ILD layer.

Figure 18:
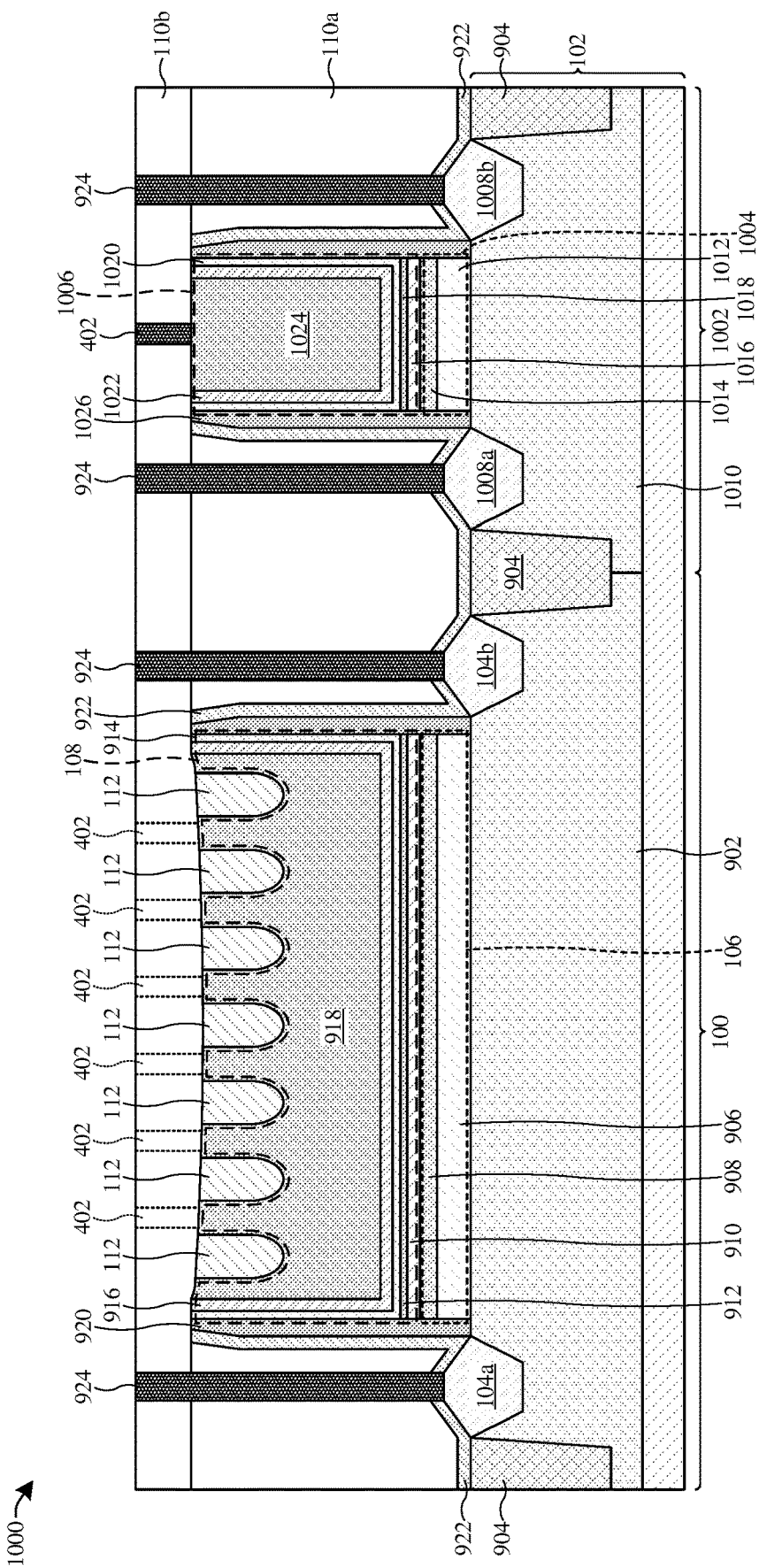

As shown in FIG. 18, a plurality of conductive gate contacts 402 are formed over the gate electrode 108 and the second gate electrode 1006. The conductive gate contacts 402 are formed extending through the upper ILD structure 110b to the gate electrode 108 and the second gate electrode 1006. Further, a plurality of conductive source/drain contacts 924 are formed over the semiconductor substrate 102 and extending through both the upper ILD structure 110b and the lower ILD structure 110a to the pair of source/drain regions 104a-b and the second pair of source/drain regions 1008a-b.

In some embodiments, a process for forming the conductive gate contacts 402 and the conductive source/drain contacts 924 comprises performing a first etch into the upper ILD structure 110b to form first contact openings (not shown) that correspond to the conductive gate contacts 402.

The first etch may be performed with a first patterned masking layer (not shown) disposed on the upper ILD structure 110b. Thereafter, a conductive material (e.g., W) is deposited on the upper ILD structure 110b and filling the first contact openings. Subsequently, a planarization process (e.g., CMP) may be performed into the conductive material and the first patterned masking layer, thereby forming the conductive gate contacts 402. In further embodiments, a second etch is performed into the upper ILD structure 110b and the lower ILD structure 110a to form second contact openings (not shown) that correspond to the conductive source/drain contacts 924. The second etch may be performed with a second patterned masking layer (not shown) disposed on the upper ILD structure 110b. Thereafter, the conductive material (e.g., W) is deposited on the upper ILD structure 110b and filling the second contact openings. Subsequently, a planarization process (e.g., CMP) may be performed into the conductive material and the second patterned masking layer, thereby forming the conductive source/drain contacts 924. Although not shown, additional dielectric layers (e.g., ILD layers) and/or conductive features (e.g., metal lines, metal vias, etc.) may be subsequently formed over the upper ILD structure 110b, the conductive gate contacts 402, and the conductive source/drain contacts 924.

Figure 19:
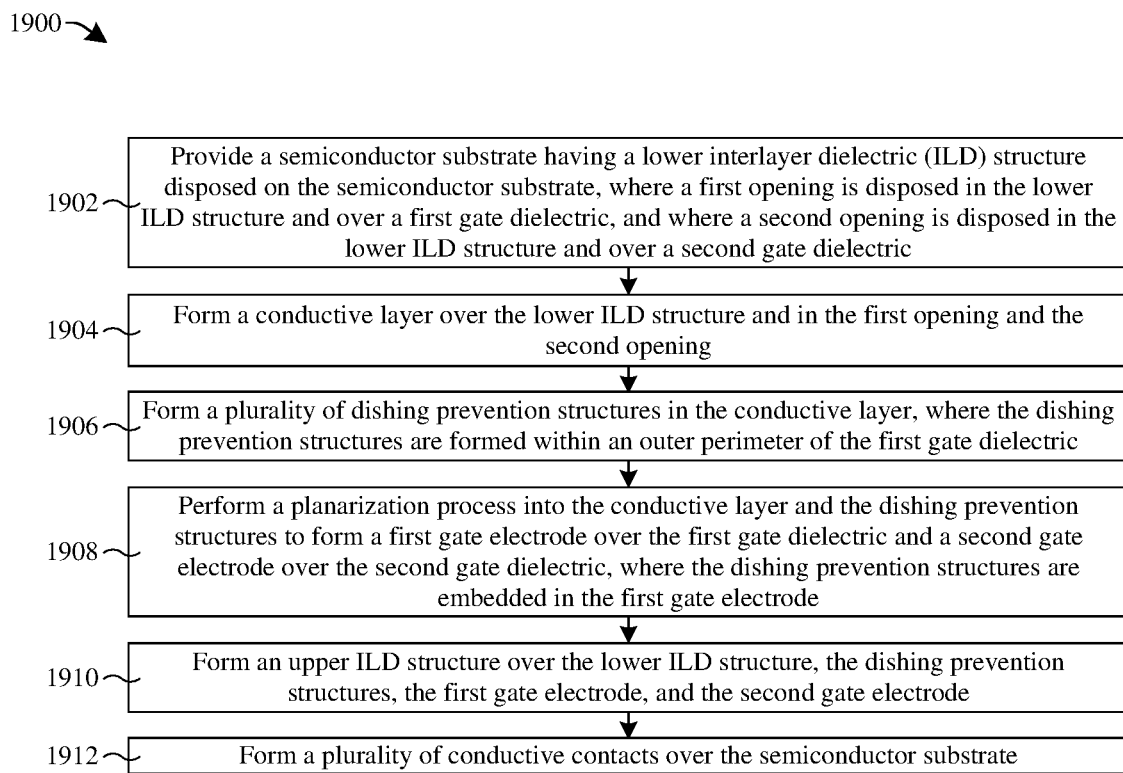
FIG. 19 illustrates a flowchart of some embodiments of a method for forming an IC having a first semiconductor device and second semiconductor device, wherein the first semiconductor device comprises a plurality of dishing prevention structures embedded in a first gate electrode.

FIG. 19 illustrates a flowchart 1900 of some embodiments of a method for forming an integrated chip (IC) having a first semiconductor device and second semiconductor device, wherein the first semiconductor device comprises a plurality of dishing prevention structures embedded in a first gate electrode. While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1902, a semiconductor substrate is provided having a lower interlayer dielectric (ILD) structure disposed on the semiconductor substrate, where a first opening is disposed in the lower ILD structure and over a first gate dielectric, and where a second opening is disposed in the lower ILD structure and over a second gate dielectric. FIG. 11 illustrates a cross-sectional view of some embodiments corresponding to act 1902.

At act 1904, a conductive layer is formed over the lower ILD structure and in the first opening and the second opening. FIG. 12 illustrates a cross-sectional view of some embodiments corresponding to act 1904.

At act 1906, a plurality of dishing prevention structures are formed in the conductive layer, where the dishing prevention structures are formed within an outer perimeter of the first gate dielectric. FIGS. 13-15 illustrate a series of cross-sectional views of some embodiments corresponding to act 1906.

At act 1908, a planarization process is performed into the conductive layer and the dishing prevention structure to form a first gate electrode over the first gate dielectric and a second gate electrode over the second gate dielectric, where the dishing prevention structures are embedded in the first gate electrode. FIG. 16 illustrates a cross-sectional view of some embodiments corresponding to act 1908.

At act 1910, an upper ILD structure is formed over the lower ILD structure, the dishing prevention structures, the first gate electrode, and the second gate electrode. FIG. 17 illustrates a cross-sectional view of some embodiments corresponding to act 1910.

At act 1912, a plurality of conductive contacts are formed over the semiconductor substrate. FIG. 18 illustrates a cross-sectional view of some embodiments corresponding to act 1912.

In some embodiments, the present application provides a semiconductor device. The semiconductor device comprises a semiconductor substrate. A gate dielectric is disposed over the semiconductor substrate. A first source/drain region and a second source/drain region are disposed in the semiconductor substrate and on opposite sides of the gate dielectric. A gate electrode is disposed over the gate dielectric. A first dishing prevention structure is embedded in the gate electrode, where a perimeter of the first dishing prevention structure is disposed within a perimeter of the gate electrode.

In some embodiments, the present application provides an integrated chip (IC). The IC comprises a semiconductor substrate. A first gate dielectric is disposed over the semiconductor substrate. A first gate electrode is disposed over the first gate dielectric, where the first gate electrode has a first length. A second gate dielectric is disposed over the semiconductor substrate and spaced from the first gate dielectric. A second gate electrode is disposed over the semiconductor substrate and spaced from the first gate electrode, where the second gate electrode has a second length greater than the first length. A dielectric structure is embedded in the second gate electrode, where outer sidewalls of the dielectric structure are disposed within outer sidewalls of the second gate electrode.

In some embodiments, the present application provides a method. The method comprises forming a first opening over a gate dielectric, where the gate dielectric is disposed on a semiconductor substrate. A conductive layer is deposited over the gate dielectric and in the first opening. A second opening is formed in the conductive layer and spaced from the gate dielectric, where a perimeter of the second opening is disposed within a perimeter of the gate dielectric. A dishing prevention layer is deposited on the conductive layer and in the second opening. A gate electrode and a dishing prevention structure embedded in the gate electrode are formed by performing a chemical-mechanical polishing (CMP) process into the dishing prevention layer and the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method comprising:
   forming a first dielectric layer over a semiconductor substrate;
   forming a first opening in the first dielectric layer and over a gate dielectric structure, wherein the first opening at least partially overlies the gate dielectric structure;

forming a conductive layer over the gate dielectric structure and in the first opening;

forming a plurality of second openings in the conductive layer and vertically spaced from the gate dielectric structure, wherein a perimeter of the gate dielectric structure laterally surrounds the plurality of second openings;

forming a dishing prevention layer on the conductive layer and in the plurality of second openings; and performing a planarization process on the dishing prevention layer and the conductive layer.

2. The method of claim 1, wherein the planarization process is a chemical-mechanical polishing (CMP) process.

3. The method of claim 1, wherein the planarization process forms a gate electrode structure over the gate dielectric structure and forms a plurality of dishing prevention structures embedded in the gate electrode structure.

4. The method of claim 3, further comprising:
forming a second dielectric layer over the first dielectric layer, the gate electrode structure, and the plurality of dishing prevention structures.

5. The method of claim 4, further comprising:
forming a conductive contact that extends vertically through both the first dielectric layer and the second dielectric layer.

6. The method of claim 5, further comprising:
forming a first source/drain region and a second source/drain region in the semiconductor substrate, wherein the first source/drain region and the second source/drain region are disposed on opposite sides of the gate dielectric structure, and wherein the conductive contact is formed extending vertically from the first source/drain region.

7. The method of claim 1, wherein forming the plurality of second openings comprises removing portions of the conductive layer.

8. The method of claim 1, wherein forming the plurality of second openings comprises performing an etching process on the conductive layer.

9. The method of claim 8, further comprising:
before the plurality of second openings are formed, forming a patterned masking layer over the conductive layer, wherein the etching process is performed on the conductive layer with the patterned masking layer in place over the conductive layer.

10. The method of claim 1, wherein each of the plurality of second openings are formed laterally spaced from sidewalls of the first opening.

11. The method of claim 10, wherein the sidewalls of the first opening define a closed loop path that extends laterally around the plurality of second openings.

12. The method of claim 1, wherein the second openings of the plurality of second openings are laterally spaced from one another.

13. A method, the method comprising:
depositing an interlayer dielectric (ILD) layer over a semiconductor substrate;
forming a first opening in the ILD layer and overlying a gate dielectric structure;
depositing a gate electrode material layer over the gate dielectric structure and in the first opening, wherein the gate electrode material layer is formed with an upper surface that is disposed over an upper surface of the ILD layer and that extends continuously from a first side of the first opening to a second side of the first opening opposite the first side;

forming a second opening in the gate electrode material layer and vertically spaced from the gate dielectric structure, wherein forming the second opening comprises removing a portion of the gate electrode material layer that overlies the gate dielectric structure;

forming a dishing prevention layer on the gate electrode material layer and in the second opening; and performing a planarization process on the dishing prevention layer and the gate electrode material layer.

14. The method of claim 13, wherein forming the first opening comprises removing a dummy gate electrode structure.

15. The method of claim 13, wherein forming the second opening comprises etching the gate electrode material layer by exposing the upper surface of the gate electrode material layer to an etchant.

16. The method of claim 13, wherein:
the gate electrode material layer has a first planarization removal rate that corresponds to a rate in which the planarization process removes the gate electrode material layer;
the dishing prevention layer has a second planarization removal rate that corresponds to a rate in which the planarization process removes the dishing prevention layer; and
the second planarization removal rate is less than the first planarization removal rate.

17. The method of claim 13, wherein the gate electrode material layer is a metal layer.

18. The method of claim 13, further comprising:
forming a sidewall spacer over the semiconductor substrate, wherein a perimeter of the sidewall spacer laterally surrounds the second opening.

19. A method, the method comprising:
forming a first dielectric layer over a semiconductor substrate;
forming a first opening in the first dielectric layer and overlying a first gate dielectric structure, wherein forming the first opening comprises removing a first dummy gate electrode structure;
forming a second opening in the first dielectric layer and overlying a second gate dielectric structure, wherein forming the second opening comprises removing a second dummy gate electrode structure, and wherein the second opening is laterally spaced from the first opening;
depositing a conductive layer over both the first gate dielectric structure and the second gate dielectric structure and in both the first opening and the second opening, wherein the conductive layer is formed with an upper surface that is disposed over an upper surface of the first dielectric layer, and wherein the upper surface of the conductive layer extends laterally over both the first opening and the second opening;
forming a patterned masking layer over the upper surface of the conductive layer, the first opening, and the second opening;
forming a third opening in the conductive layer and vertically spaced from the first gate dielectric structure, wherein forming the third opening comprises performing an etching process on the conductive layer to remove a portion of the conductive layer overlying the first gate dielectric structure, and wherein the etching process is performed with the patterned masking layer in place over the upper surface of the conductive layer;
forming a dishing prevention layer over the conductive layer and in the third opening; and performing a chemical-mechanical polishing (CMP) process on the dishing prevention layer and the conductive layer, thereby forming a first gate electrode structure overlying the first gate dielectric structure, a second gate electrode structure overlying the second gate dielectric structure, and a dishing prevention structure embedded in the first gate electrode structure.

20. The method of claim 19, further comprising:

forming a second dielectric layer over the first dielectric layer, the first gate electrode structure, the second gate electrode structure, and the dishing prevention structure; and forming a conductive contact that extends vertically through both the first dielectric layer and the second dielectric layer to a source/drain region.

* * * * *